(12) United States Patent
Sato

(10) Patent No.: US 11,094,569 B2
(45) Date of Patent: Aug. 17, 2021

(54) SUBSTRATE PROCESSING APPARATUS

(71) Applicant: TOKYO ELECTRON LIMITED, Tokyo (JP)

(72) Inventor: Yoshitomo Sato, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 269 days.

(21) Appl. No.: 16/101,642

(22) Filed: Aug. 13, 2018

(65) Prior Publication Data

US 2019/0057890 A1    Feb. 21, 2019

(30) Foreign Application Priority Data

Aug. 15, 2017  (JP) .............................. JP2017-156945

(51) Int. Cl.
*H01L 21/67*   (2006.01)
*H01L 21/68*   (2006.01)
*G06T 7/62*    (2017.01)
*G06T 7/00*    (2017.01)

(52) U.S. Cl.
CPC ...... *H01L 21/67253* (2013.01); *G06T 7/0004* (2013.01); *G06T 7/62* (2017.01); *H01L 21/6708* (2013.01); *H01L 21/67028* (2013.01); *H01L 21/67051* (2013.01); *H01L 21/67259* (2013.01); *H01L 21/67265* (2013.01); *H01L 21/67288* (2013.01); *H01L 21/681* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 2008/0200100 A1* | 8/2008 | Takahashi | ............. H01L 21/461 451/44 |
| 2013/0206726 A1* | 8/2013 | Oono | ................ H01L 21/67253 216/85 |
| 2016/0148366 A1* | 5/2016 | Amano | ................. G06T 7/0008 348/87 |

FOREIGN PATENT DOCUMENTS

| | | |
|---|---|---|
| JP | 2008-537316 | 9/2008 |
| JP | 2013-168429 | 8/2013 |
| JP | 2016-100565 | 5/2016 |

* cited by examiner

*Primary Examiner* — Karla A Moore
(74) *Attorney, Agent, or Firm* — Amin, Turocy & Watson, LLP

(57) ABSTRACT

A substrate processing apparatus according to an embodiment includes a cassette placing section, a processing unit, a transfer area, and an image capturing unit. On the cassette placing section, a cassette accommodating a plurality of substrates is placed. The processing unit washes or etches a peripheral portion of each substrate taken out from the cassette. The transfer area is interposed between the cassette placing section and the processing unit, and the substrate is transferred therein. The image capturing unit is disposed in the transfer area to capture an image of the substrate processed by the processing unit. The image includes both of (i) a peripheral portion of an upper surface or a lower surface of the substrate and (ii) an end face of the substrate.

19 Claims, 14 Drawing Sheets

SUBSTRATE PROCESSING APPARATUS

CROSS-REFERENCE TO RELATED APPLICATIONS

The present application claims priority to and incorporates by reference the entire contents of Japanese Patent Application No. 2017-156945 filed in Japan on Aug. 15, 2017.

FIELD

The present invention relates to a substrate processing apparatus.

BACKGROUND

Conventionally, there has been known a substrate processing apparatus that performs a process for supplying chemical solution on a peripheral portion of a substrate, such as a silicon wafer and a compound semiconductor wafer (hereinafter, may be referred to as "peripheral portion removing process"), so as to remove a film from the peripheral portion of the substrate.

In this type of substrate processing apparatus, in order to check whether or not the film has been appropriately removed from the peripheral portion of the substrate, a camera that captures an image of the peripheral portion of the substrate is provided inside of the chamber in which the peripheral portion removing process is performed.

For example, Japanese Laid-open Patent Publication No. 2016-100565 discloses fixedly providing an image capturing unit that captures an image of the peripheral portion of a substrate in the chamber. Japanese Laid-open Patent Publication No. 2016-100565 also discloses providing the camera to a measurement instrument that is removable from the chamber.

However, when an image capturing unit is provided inside of the chamber, there presents possibility that the size of the apparatus is increased.

SUMMARY

A substrate processing apparatus according to an embodiment includes a cassette placing section, a processing unit, a transfer area, and an image capturing unit. On the cassette placing section, a cassette accommodating a plurality of substrates is placed. The processing unit washes or etches a peripheral portion of each substrate taken out from the cassette. The transfer area is interposed between the cassette placing section and the processing unit, and the substrate is transferred therein. The image capturing unit is disposed in the transfer area to capture an image of the substrate processed by the processing unit. The image includes both of (i) a peripheral portion of an upper surface or a lower surface of the substrate and (ii) an end face of the substrate.

BRIEF DESCRIPTION OF DRAWINGS

One should be able to achieve more comprehensive understanding of the present invention and advantages achieved thereby by reading the description of embodiments below, while referring to the accompanying drawings.

DESCRIPTION OF EMBODIMENTS

Configuration of Substrate Processing System

Figure 1:
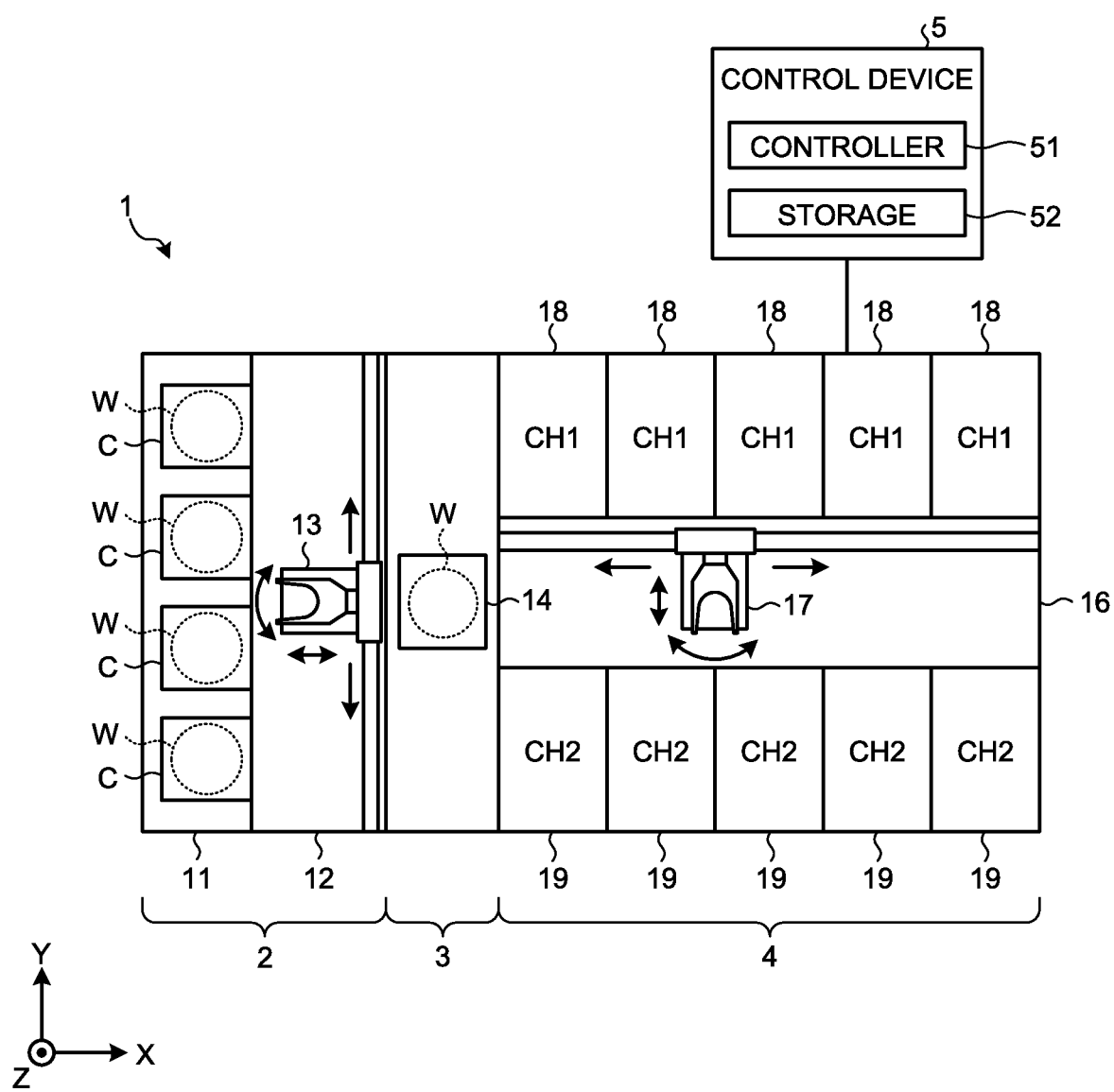
FIG. 1 is a schematic plan view illustrating a substrate processing system according to an embodiment.
Figure 2:
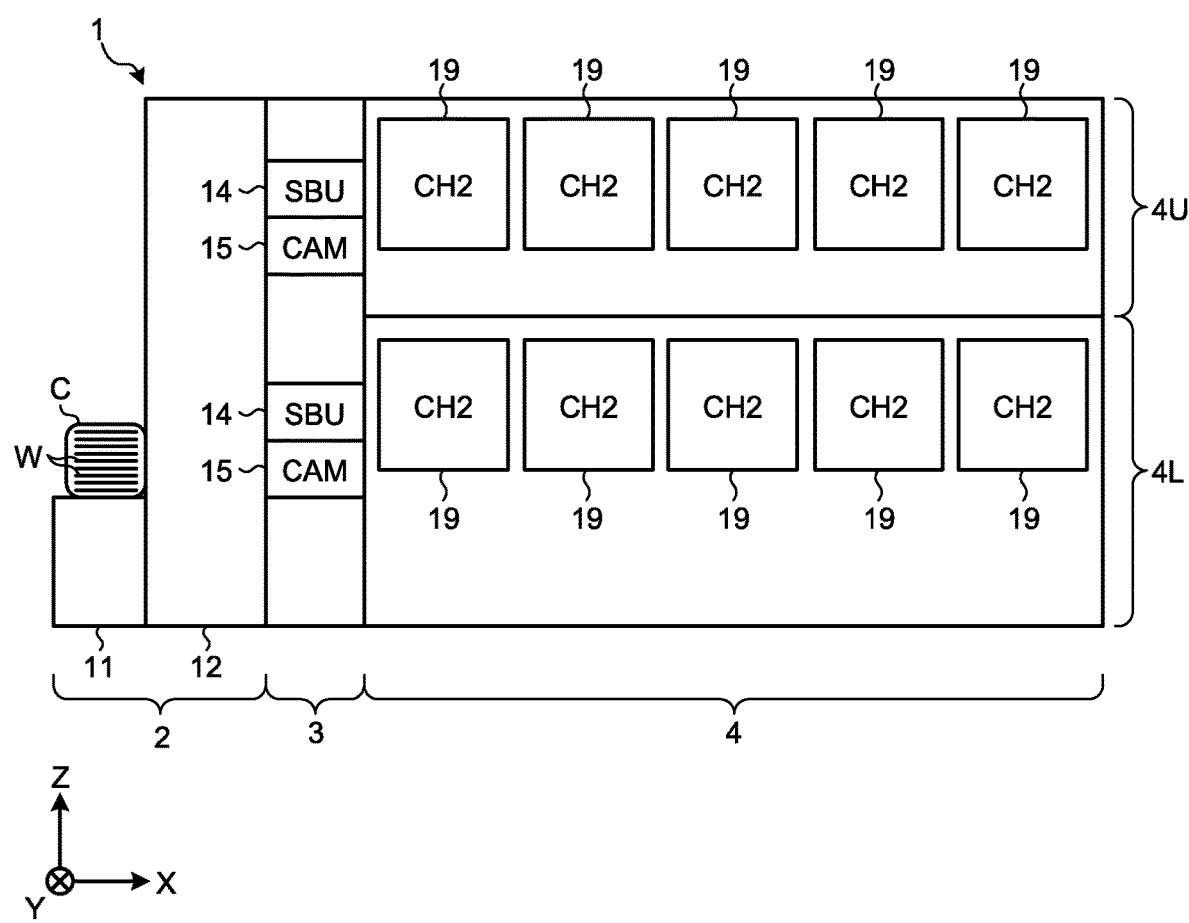
FIG. 2 is a schematic side view illustrating the substrate processing system according to the embodiment.

A configuration of a substrate processing system according to one embodiment will be explained with reference to FIGS. 1 and 2. FIG. 1 is a schematic plan view illustrating the substrate processing system according to the embodiment. FIG. 2 is a schematic side view illustrating the substrate processing system according to the embodiment. Hereinafter, in order to clarify positional relations, X-axis, Y-axis, and Z-axis perpendicularly intersecting with one another are defined, and a positive Z-axis direction is explained as a vertically upward direction.

As illustrated in FIG. 1, a substrate processing system 1 according to the embodiment includes a carry-in/out station 2, a delivery station 3, and a processing station 4. The carry-in/out station 2, the delivery station 3, and the processing station 4 are arranged in the order listed herein.

The substrate processing system 1 transfers a substrate, which is a semiconductor wafer (hereinafter, wafer W) in this embodiment, carried in from the carry-in/out station 2 into the processing station 4 via the delivery station 3, and processes the wafer W in the processing station 4. The substrate processing system 1 returns the processed wafer W from the processing station 4 to the carry-in/out station 2 via the delivery station 3, and discharges the wafer W to the external via the carry-in/out station 2.

The carry-in/out station 2 includes a cassette placing section 11 and a transfer section 12. A plurality of cassettes C for accommodating a plurality of respective wafers W orientated horizontally are placed on the cassette placing section 11.

The transfer section 12 is positioned between the cassette placing section 11 and the delivery station 3, and a first transfer device 13 is provided inside of the transfer section 12. The first transfer device 13 is provided with a plurality of (five, in this example) wafer holding sections each of which holds one wafer W. The first transfer device 13 can be moved in the horizontal directions and the vertical directions, and turned about a vertical axis, and is capable of transferring a plurality of wafers W between the cassette C and the delivery station 3 simultaneously, using the wafer holding sections.

The delivery station 3 will now be explained. As illustrated in FIGS. 1 and 2, a plurality of substrate placing sections (SBU) 14 and a plurality of image capturing units (CAM) 15 are disposed inside of the delivery station 3. Specifically, the processing station 4, which will be described later, has a first processing station 4U in an upper level, and a second processing station 4L in a lower level, and one substrate placing section 14 and one image capturing unit 15 are provided to a position corresponding to each of the first processing station 4U and the second processing station 4L. Configurations of the substrate placing section 14 and the image capturing unit 15 will be described later.

The processing station 4 will now be explained. The processing station 4 includes, as illustrated in FIG. 2, the first processing station 4U and the second processing station 4L. The first processing station 4U and the second processing station 4L are spatially partitioned by a separator, a shutter, or the like, and are arranged side by side in the height direction.

The first processing station 4U and the second processing station 4L have the same configuration, and include, as illustrated in FIG. 1, a transfer section 16, as second transfer device 17, a plurality of peripheral portion processing units (CH1) 18, and a plurality of lower surface processing units (CH2) 19.

The second transfer device 17 is disposed inside of the transfer section 16, and transfers the wafer W to and from the substrate placing section 14, the image capturing unit 15, the peripheral portion processing units 18, and the lower surface processing units 19.

The second transfer device 17 includes one wafer holder for holding one wafer W. The second transfer device 17 can be moved in the horizontal directions and the vertical directions, and turned about the vertical axis, and transfers one wafer W using the wafer holder.

The peripheral portion processing units 18 and the lower surface processing units 19 are positioned adjacently to the transfer section 16. As an example, the peripheral portion processing units 18 are arranged along X-axis direction, on the positive side of Y-axis direction with respect to the transfer section 16, and the lower surface processing units 19 are arranged along X-axis direction, on the negative side of Y-axis with respect to the transfer section 16.

The peripheral portion processing unit 18 performs a predetermined process on the peripheral portion of the wafer W. In this embodiment, the peripheral portion processing unit 18 performs a bevel removing process (one example of peripheral portion process) for removing film from the bevel portions of the wafer W by etching. The bevel portions are inclined portions formed on and around the end face of the wafer W. The inclined portions are formed on the peripheral portion around the upper surface and the peripheral portion of the lower surface of the wafer W.

Figure 3:
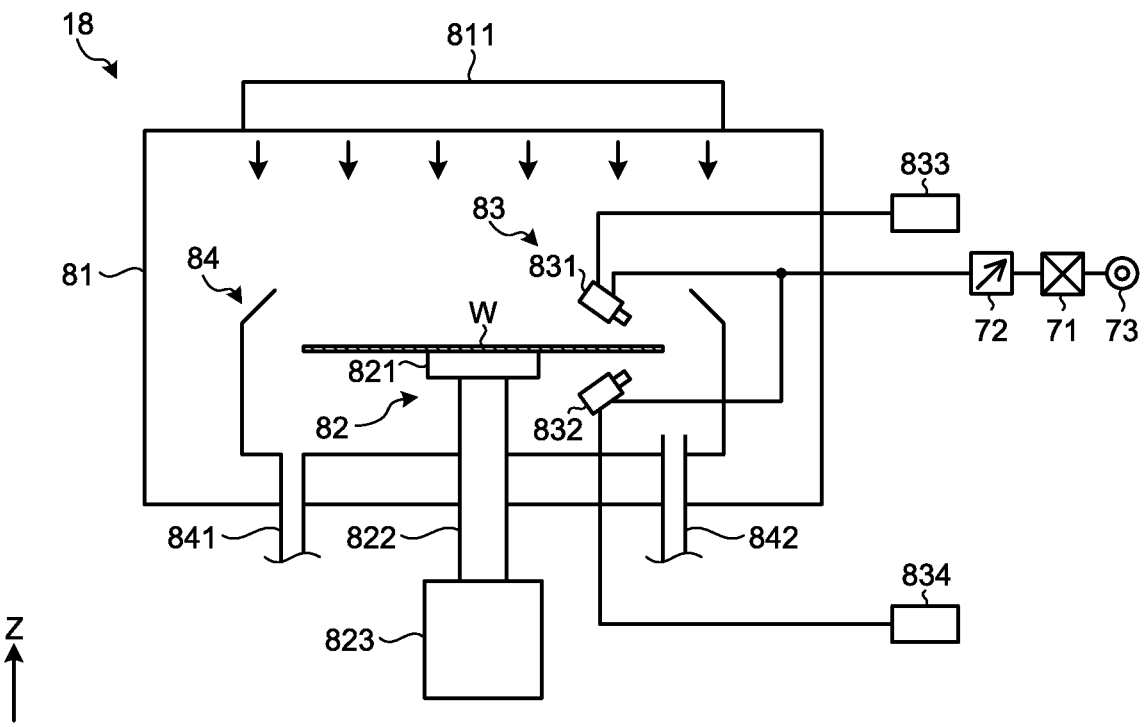
FIG. 3 is a schematic view illustrating a peripheral portion processing unit.

An exemplary configuration of the peripheral portion processing unit 18 will now be explained with reference to FIG. 3. FIG. 3 is a schematic view illustrating the peripheral portion processing unit 18.

As illustrated in FIG. 3, the peripheral portion processing unit 18 includes a chamber 81, a substrate holding mechanism 82, a supplying section 83, and a recovery cup 84.

The chamber 81 accommodates the substrate holding mechanism 82, the supplying section 83, and the recovery cup 84. On the ceiling portion of the chamber 81, a fan filter unit (FFU) 811 for generating a downflow inside of the chamber 81 is provided.

The substrate holding mechanism 82 includes a holding section 821 that holds the wafer W horizontally, a support member 822 that extends in the vertical direction and supports the holding section 821, and a driving section 823 that causes the support member 822 to rotate around a vertical axis.

The holding section 821 is connected with a suction device (not illustrated) such as a vacuum pump, and holds the wafer W horizontally by suctioning the lower surface of the wafer W with the negative pressure generated by the suction device suctioning the air. As the holding section 821, a porous chuck or an electrostatic chuck may be used, for example.

The holding section 821 has a suction area having a diameter smaller than that of the wafer W. With this configuration, the chemical solution discharged from a lower nozzle 832 of the supplying section 83, which will be described later, can be supplied to the peripheral portion of the lower surface of the wafer W.

The supplying section 83 includes an upper nozzle 831 and a lower nozzle 832. The upper nozzle 831 is positioned above the wafer W held by the substrate holding mechanism 82, and the lower nozzle 832 is positioned below the wafer W.

A chemical solution supply source 73 is connected to the upper nozzle 831 and the lower nozzle 832 via a valve 71 and a flow controller 72. The upper nozzle 831 discharges the chemical solution, such as hydrofluoric acid (HF) or nitric acid (HNO3), supplied from the chemical solution supply source 73 to the peripheral portion around the upper surface of the wafer W held by the substrate holding mechanism 82. The lower nozzle 832 also discharges the chemical solution supplied from the chemical solution supply source 73 to the peripheral portion of the lower surface of the wafer W held by the substrate holding mechanism 82.

The supplying section 83 also includes a first moving mechanism 833 that moves the upper nozzle 831, and a second moving mechanism 834 that moves the lower nozzle 832. The positions from which the chemical solution is to be supplied to the wafer W can be changed by causing these first moving mechanism 833 and second moving mechanism 834 to move the upper nozzle 831 and the lower nozzle 832, respectively.

The recovery cup 84 is provided in a manner surrounding the substrate holding mechanism 82. A drain port 841 for draining the chemical solution supplied from the supplying section 83 to the external of the chamber 81, and an exhaust port 842 for exhausting the atmosphere inside of the chamber 81 are provided on the bottom portion of the recovery cup 84.

The peripheral portion processing unit 18 has the configuration described above, and holds the lower surface of the wafer W by suctioning the wafer W by using the holding section 821, and then rotates the wafer W by using the driving section 823. The peripheral portion processing unit 18 then discharges the chemical solution toward the peripheral portion around the upper surface of the rotating wafer W via the upper nozzle 831 and discharges the chemical solution toward the peripheral portion of the lower surface of the rotating wafer W via the lower nozzle 832. In this manner, the film attached to the bevel portions of the wafer W is removed. At this time, impurities such as particles attached to the bevel portions of the wafer W are also removed together with the film.

After performing the peripheral portion removing process, the peripheral portion processing unit 18 may perform a rinsing process for rinsing the chemical solution remaining on the bevel portions of the wafer W by discharging rinse agent such as deionized water from the upper nozzle 831 and the lower nozzle 832. After the rinsing process, the peripheral portion processing unit 18 may also perform the drying process for drying the wafer W by rotating the wafer W.

In the description herein, it is assumed that the peripheral portion processing unit 18 performs the bevel removing process for removing the film from the bevel portions of the wafer W by etching, as an example of the peripheral portion process, but the peripheral portion process does not necessarily need to be a process of removing film. For example, the peripheral portion processing unit 18 may perform a peripheral portion washing process for washing the bevel portions of the wafer W, as the peripheral portion process.

The lower surface processing unit 19 performs a predetermined process on the lower surface of the wafer W. In the present embodiment, the lower surface processing unit 19 performs a lower surface removing process (one example of lower surface process) for removing the film from the entire lower surface of the wafer W by etching.

Figure 4:
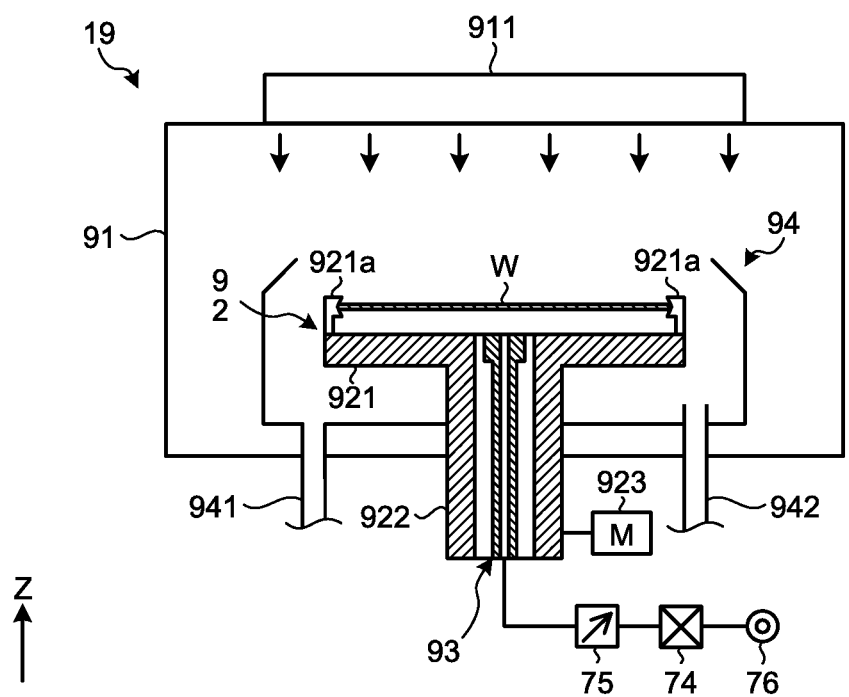
FIG. 4 is a schematic view illustrating a lower surface processing unit.

An exemplary configuration of the lower surface processing unit 19 will now be explained with reference to FIG. 4. FIG. 4 is a schematic view illustrating the lower surface processing unit 19.

As illustrated in FIG. 4, the lower surface processing unit 19 includes a chamber 91, a substrate holding mechanism 92, a supplying section 93, and a recovery cup 94.

The chamber 91 accommodates the substrate holding mechanism 92, the supplying section 93, and the recovery cup 94. On the ceiling portion of the chamber 91, an FFU 911 for generating a downflow inside of the chamber 91 is provided.

The substrate holding mechanism 92 includes a holding section 921 that holds the wafer W horizontally, a support member 922 that extends in the vertical directions and supports the holding section 921, and a driving section 923 that causes the support member 922 to rotate around a vertical axis. A plurality of gripping sections 921a for gripping the peripheral portion of the wafer W is provided on the upper surface of the holding section 921. The wafer W is held horizontally by the gripping sections 921a, in a manner slightly spaced from the upper surface of the holding section 921.

The supplying section 93 is inserted into hollow parts of the holding section 921 and of the support member 922. A channel extending in the vertical direction is provided inside of the supplying section 93. A chemical solution supply source 76 is connected to the channel via a valve 74 and a flow controller 75. The supplying section 93 supplies the chemical solution supplied from the chemical solution supply source 76 to the lower surface of the wafer W.

The recovery cup 94 is provided in a manner surrounding the substrate holding mechanism 92. A drain port 941 for draining the chemical solution suppled from the supplying section 93 to the external of the chamber 91, and an exhaust port 942 for exhausting the atmosphere inside of the chamber 91 are provided on the bottom portion of the recovery cup 94.

The lower surface processing unit 19 has the configuration described above, and holds the peripheral portion of the wafer W with the gripping sections 921a of the holding section 921, and then rotates the wafer W by using the driving section 923. The lower surface processing unit 19 then discharges the chemical solution toward the center of the lower surface of the rotating wafer W via the supplying section 93. The chemical solution supplied to the center of the lower surface of the wafer W spreads across the entire lower surface of the wafer W, as the wafer W is rotated. In this manner, the film is removed from the entire lower surface of the wafer W. At this time, impurities such as particles attached to the lower surface of the wafer W are also removed together with the film.

After performing the lower surface removing process, the lower surface processing unit 19 may perform a rinsing process for rinsing the chemical solution remaining on the lower surface of the wafer W by discharging rinse agent such as deionized water from the supplying section 93. After the rinsing process, the lower surface processing unit 19 may also perform the drying process for drying the wafer W by rotating the wafer W.

In the description herein, it is assumed that the lower surface processing unit 19 performs the lower surface removing process for removing the film from the entire lower surface of the wafer W, as an example of the lower surface processing, but lower surface processing does not necessarily need to be the process of removing a film. For example, the lower surface processing unit 19 may perform a lower surface washing process for washing the entire lower surface of the wafer W, as the lower surface processing.

As illustrated in FIG. 1, the substrate processing system 1 includes a control device 5. The control device 5 is a computer, for example, and includes a controller 51 and a storage 52. The storage 52 stores therein a computer program for controlling various processes executed by the substrate processing system 1. The controller 51 is a central processing unit (CPU), for example, and controls the operations of the substrate processing system 1 by reading the computer program stored in the storage 52 and executing the computer program.

The computer program may be stored in a computer-readable storage medium and installed to the storage 52 in the control device 5 from the storage medium. Examples of the computer-readable storage medium includes a hard disk (HD), a flexible disk (FD), a compact disc (CD), a magneto-optical disc (MO), and a memory card. The controller 51 may also be implemented using hardware, without using any computer program.

In the peripheral portion removing process, the width by which the film is removed (width in radial direction of wafer W with respect to one end that is outer edge of wafer W; hereinafter referred to as "cut width") is specified. However, when the upper nozzle 831 and the lower nozzle 832 are not positioned appropriately, for example, the actual cut width may be deviated from the specified cut width. Furthermore, when the center of the wafer W is misaligned with respect to the rotational center of the substrate holding mechanism 82, the cut width may become uneven in the circumferential direction of the wafer W. Therefore, the wafer W is checked, in some cases, by capturing an image of the wafer W after the peripheral portion removing process, and by determining as to whether or not the peripheral portion removing process has been performed appropriately based on the acquired image.

Such a camera for capturing an image of the wafer after the peripheral portion removing process has conventionally been installed inside of the chamber of each of the peripheral portion processing units. However, if the camera is provided inside of the chamber of each peripheral portion processing units, the size of the substrate processing system may become increased. Furthermore, the chemical solution or the like may become attached to the camera and make it difficult for the camera to capture an appropriate image.

There has also been a conventional disclosure in which an image of the wafer after the peripheral portion removing process is captured, by attaching a measurement instrument on which the camera is mounted to the peripheral portion processing unit after the peripheral portion removing process is performed. However, it is cumbersome to attach and to remove the measurement instrument. Furthermore, deterioration in measurement accuracy may present due to individual differences between the peripheral portion processing units.

To address these issues, in the substrate processing system 1 according to the embodiment, one image capturing unit 15 for capturing an image of the bevel portions of the wafer W after the peripheral portion removing process is provided external of the peripheral portion processing units 18, in a manner shared among the peripheral portion processing units 18. Specifically, in the substrate processing system 1, one image capturing unit 15 is provided correspondingly to the peripheral portion processing units 18 that are arranged in the first processing station 4U, and another image capturing unit 15 is provided correspondingly to the peripheral portion processing units 18 that are arranged in the second processing station 4L, in the delivery station 3 (see FIG. 2).

Configuration of Image Capturing Unit

A configuration of the image capturing unit 15 according to the embodiment will be explained specifically with reference to FIGS. 5 to 13.

Figure 5:
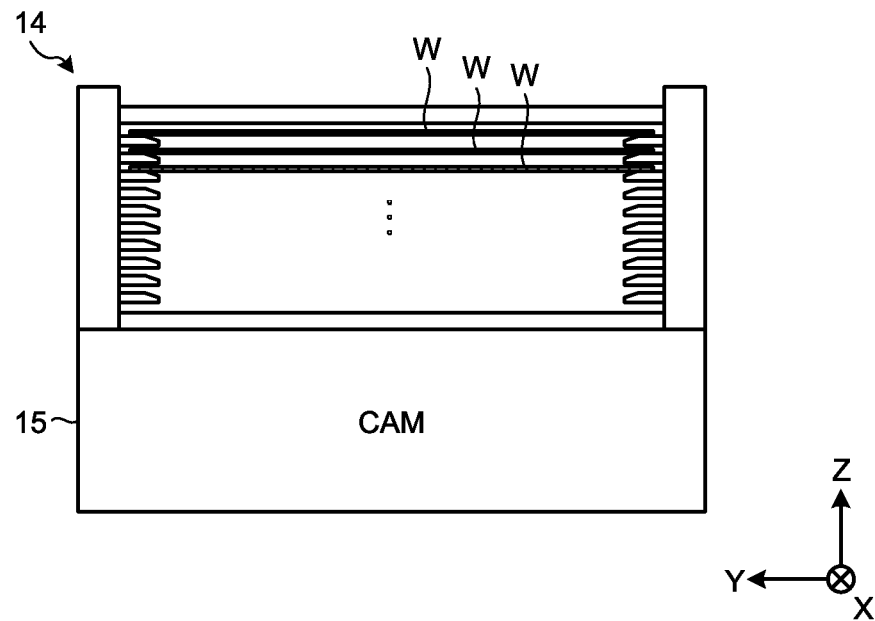
FIG. 5 is a schematic view illustrating a substrate placing section and an image capturing unit seen from a side.

FIG. 5 is a schematic view illustrating the substrate placing section 14 and the image capturing unit 15 seen from a side. As illustrated in FIG. 5, the image capturing unit 15 is provided adjacently to and below the substrate placing section 14.

In this manner, when the substrate placing section 14 and the image capturing unit 15 are stacked in the height direction, it is possible to suppress an increase in the footprint of the substrate processing system 1. Furthermore, by arranging the image capturing unit 15 below the substrate placing section 14, even when a dust or the like falls from the image capturing unit 15, it is possible to prevent the fallen dust or the like from attaching the wafer W placed on the substrate placing section 14.

The image capturing unit 15, however, does not necessarily need to be positioned below the substrate placing section 14, and may be positioned above the substrate placing section 14.

Figure 6:
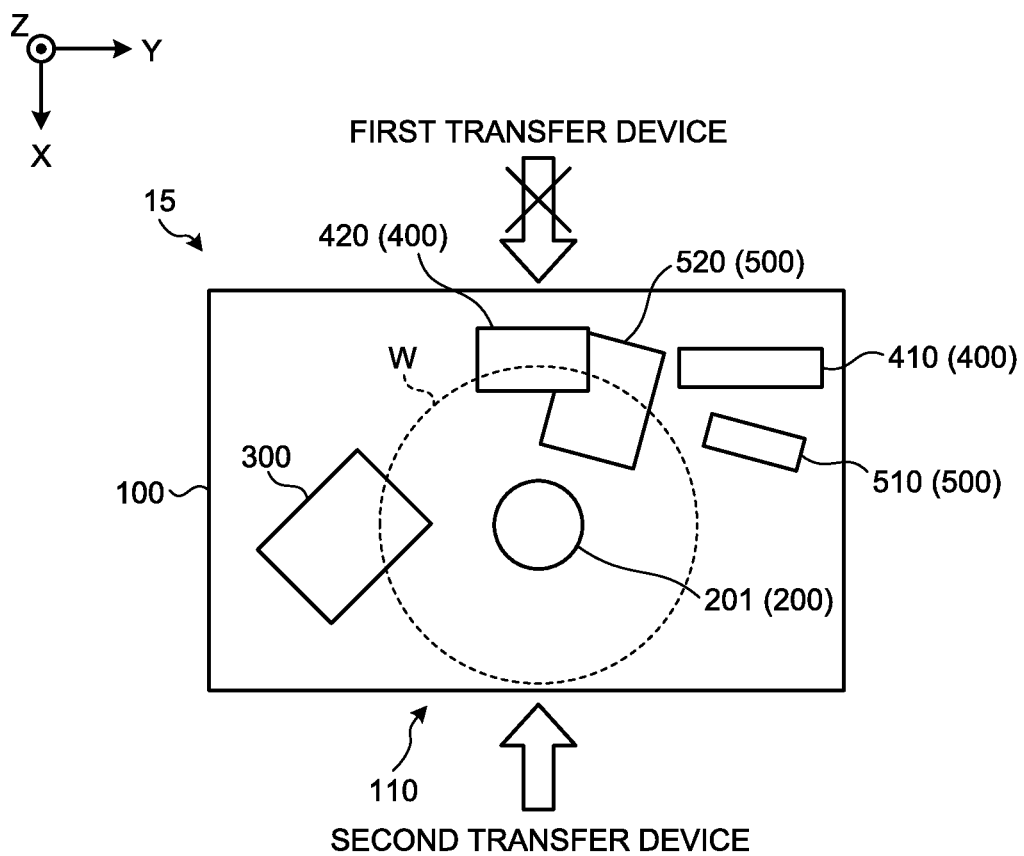
FIG. 6 is a schematic view illustrating the image capturing unit seen from above.
Figure 7:
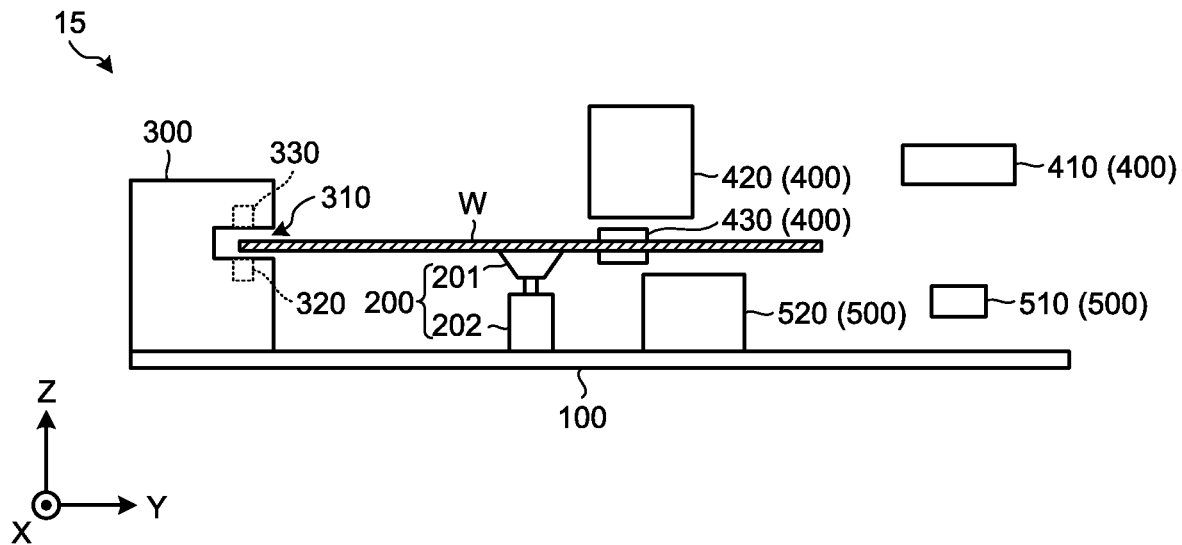
FIG. 7 is a schematic view illustrating the image capturing unit seen from a side.

FIG. 6 is a schematic view illustrating the image capturing unit 15 seen from above, and FIG. 7 is a schematic view illustrating the image capturing unit 15 seen from a side.

As illustrated in FIG. 6, the image capturing unit 15 includes a base plate 100, a rotating holding subunit 200 (one example of rotating holding section), a notch detecting subunit 300 (one example of detecting unit), a first image capturing subunit 400, and a second image capturing subunit 500.

In the substrate processing system 1 according to the embodiment, only the second transfer device 17 is able to access the image capturing unit 15, among the first transfer device 13 and the second transfer device 17. Specifically, the image capturing unit 15 has an opening 110 that opens toward the transfer section 16, and the second transfer device 17 conveys the wafer W to the image capturing unit 15, via the opening 110. Furthermore, a camera 410, an illumination module 420, and a mirror member 430 included in the first image capturing subunit 400 and a camera 510 and an illumination module 520 included in the second image capturing subunit 500, all of which will be described later, are located at a distance farther from the opening 110 than a holding table 201 so as not to interfere the second transfer device 17 in carrying in/out of the wafer W.

The base plate 100 is a plate-like member, for example, and the subunits 200 to 500 are placed on the base plate 100.

The rotating holding subunit 200 includes the holding table 201 and an actuator 202. The holding table 201 is a suction chuck that holds the wafer W horizontally by suctioning the wafer W, for example. The holding table 201 has a suction area having a diameter smaller than that of the wafer W. The actuator 202 is an electric motor, for example, and rotatably drives the holding table 201.

The notch detecting subunit 300 has a transversal groove 310, for example, and a light-emitting element 320 is provided on the lower surface of the transversal groove 310, and a light-receiving element 330 is provided on the upper surface of the transversal groove 310.

With the wafer W placed on the rotating holding subunit 200, the peripheral portion of the wafer W blocks the light emitted from the light-emitting element 320, and the light-receiving element 330 does not receive the emitted light. As the wafer W is rotated by the rotating holding subunit 200, the notch formed on the peripheral portion of the wafer W arrives at the position facing the light-emitting element 320, and the emitted light passes through the notch and received by the light-receiving element 330. In this manner, the notch detecting subunit 300 is able to detect the position of the notch formed on the wafer W.

Figure 8:
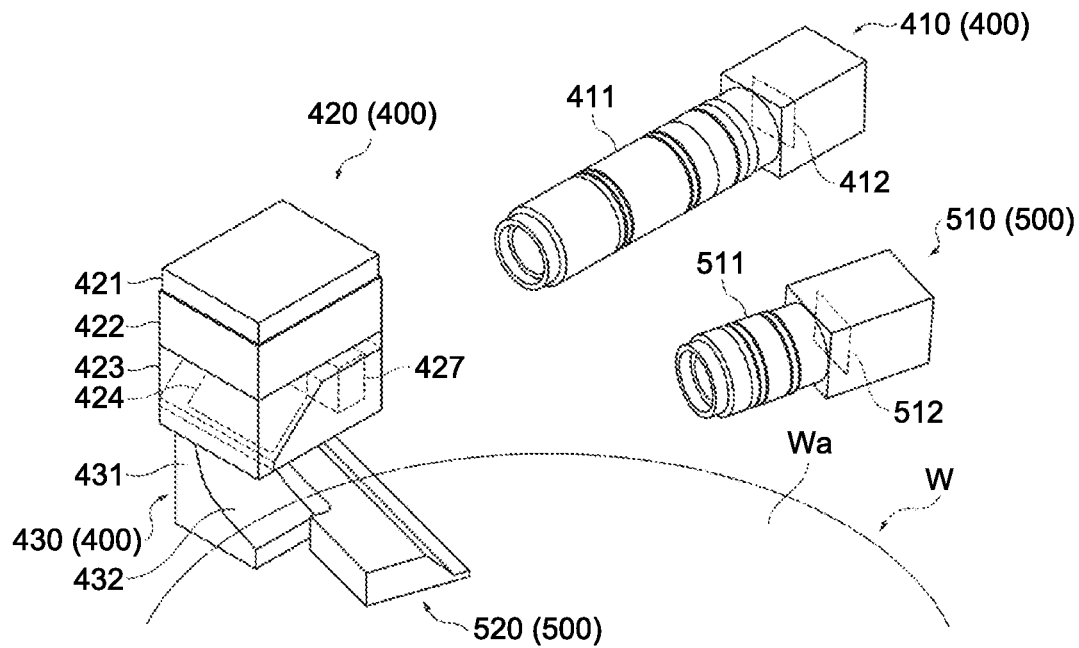
FIG. 8 is a schematic view illustrating a first image capturing subunit and a second image capturing subunit seen diagonally from above.
Figure 9:
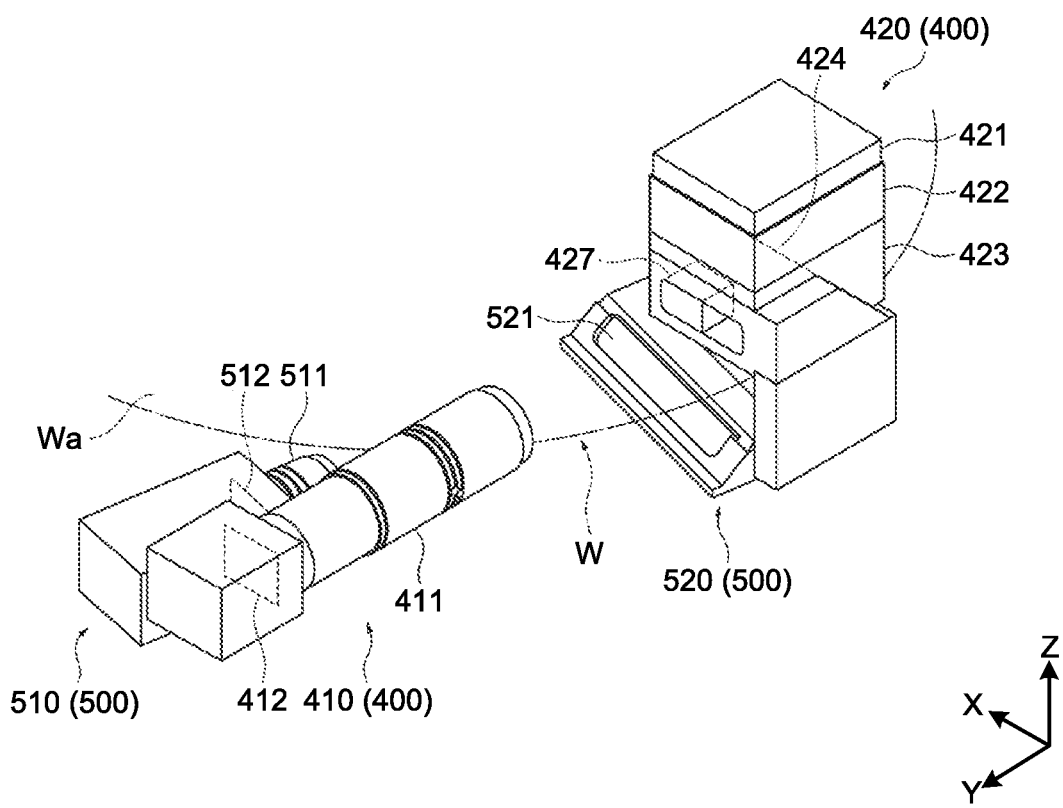
FIG. 9 is a schematic view illustrating the first image capturing subunit and the second image capturing subunit seen diagonally from above.
Figure 10:
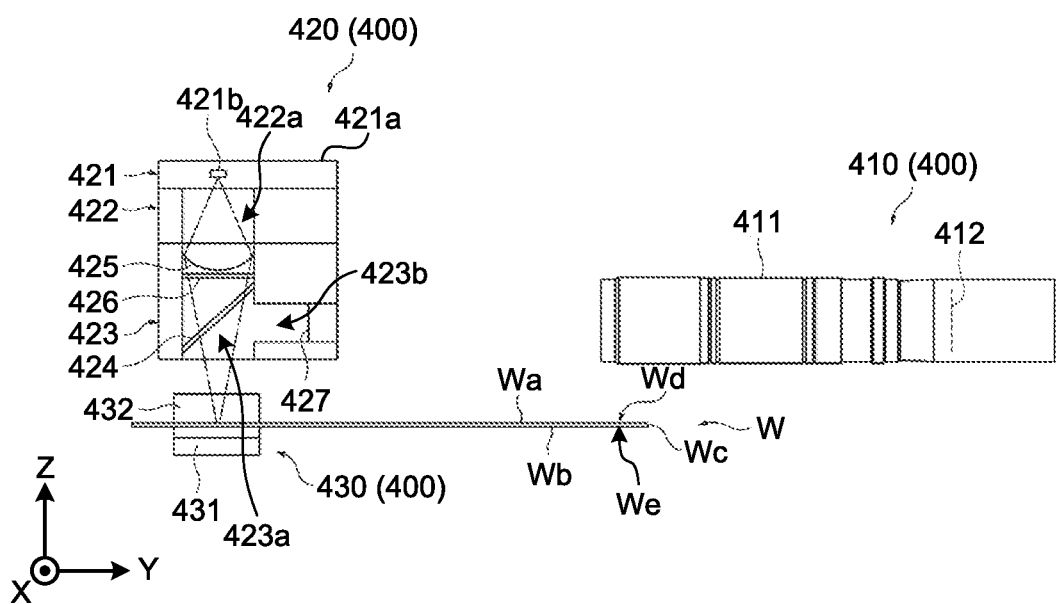
FIG. 10 is a schematic view illustrating the first image capturing subunit seen from a side.
Figure 11:
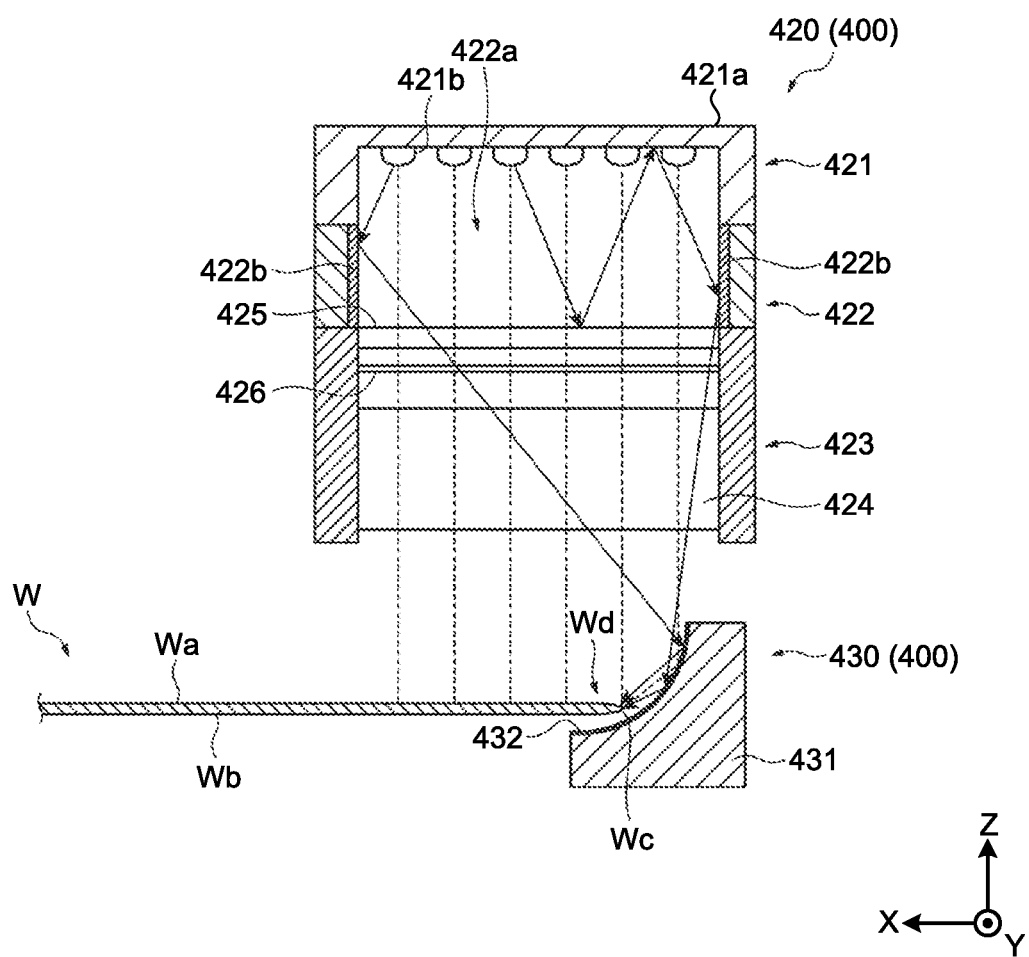
FIG. 11 is a schematic view illustrating an illumination module and a mirror member seen from a side.
Figure 12:
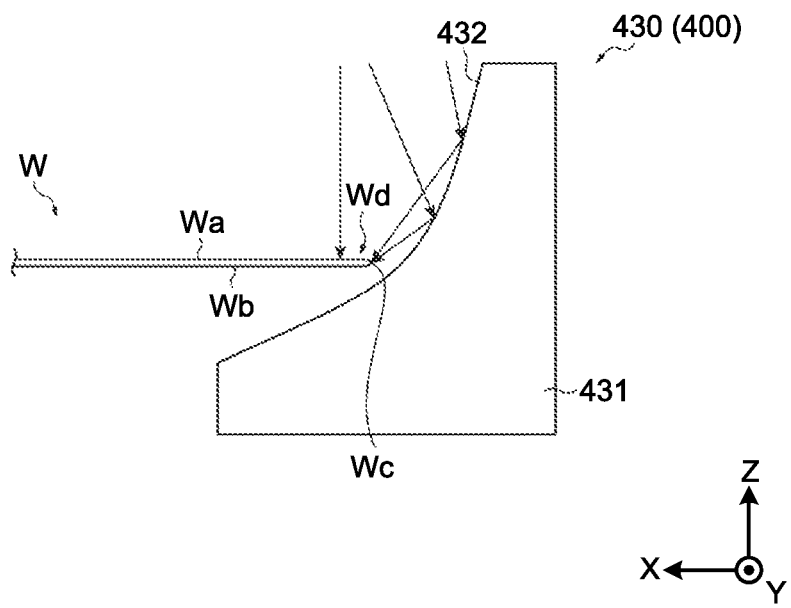
FIG. 12 is a schematic view illustrating how the light from the illumination module is reflected from the mirror member.
Figure 13:
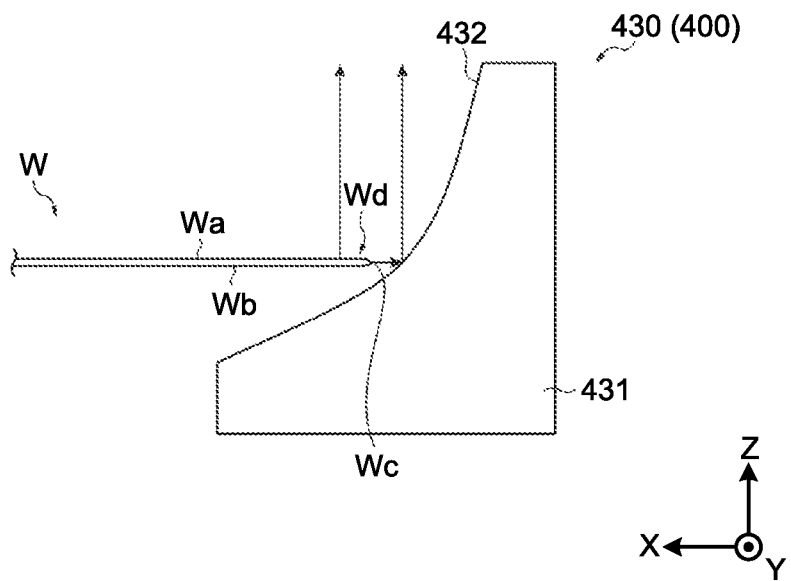
FIG. 13 is a schematic view illustrating how the light from a wafer is reflected from the mirror member.

FIGS. 8 and 9 are schematics views illustrating the first image capturing subunit 400 and the second image capturing subunit 500 seen diagonally from above. FIG. 10 is a schematic view illustrating the first image capturing subunit 400 seen from a side, and FIG. 11 is a schematic view illustrating the illumination module 420 and the mirror member 430 seen from a side. FIG. 12 is a schematic view illustrating how the light from the illumination module 420 is reflected from the mirror member 430. FIG. 13 is a schematic view illustrating how the light from the wafer W is reflected from the mirror member 430.

As illustrated in FIGS. 6 to 10, the first image capturing subunit 400 includes the camera 410 (one example of image capturing unit on side of one surface), the illumination module 420, and the mirror member 430.

The camera 410 includes a lens 411 and an image sensor 412. The optical axis of the camera 410 extends horizontally toward the illumination module 420.

As illustrated in FIGS. 8 to 11, the illumination module 420 is positioned above the wafer W held by the holding table 201. The illumination module 420 includes a light source 421, a light scattering member 422, and a holding member 423.

The light source 421 includes, as illustrated in FIG. 11, a housing 421a and a plurality of LED point light sources 421b that are disposed inside of the housing 421a, for example. The LED point light sources 421b are arranged in a row along the radial direction of the wafer W.

The light scattering member 422 is connected to the light source 421 so as to be overlapped with the light source 421, as illustrated in FIGS. 9 to 11. The light scattering member 422 has a pass-through hole 422a extending in the direction in which the light source 421 and the light scattering member 422 are stacked. A mirror finish is applied on the inner surface of the wall of the pass-through hole 422a. In this manner, when light emitted from the light source 421 is made incident on the pass-through hole 422a of the light scattering member 422, the incident light becomes diffused on a mirror surface portion 422b of the pass-through hole 422a so as to generate scattered light.

The holding member 423 is connected to the light scattering member 422 so as to be overlapped with the light scattering member 422. The holding member 423 has a pass-through hole 423a, and an intersecting hole 423b intersecting with the pass-through hole 423a. The pass-through hole 423a extends in the direction in which the light scattering member 422 and the holding member 423 are stacked. The intersecting hole 423b communicates with the pass-through hole 423a.

The holding member 423 holds therein a half mirror 424, a cylindrical lens 425, a light diffusing member 426, and a focusing lens 427. The half mirror 424 is disposed at the portion where the pass-through hole 423a and the intersecting hole 423b intersect each other, in a configuration inclined by an angle of 45 degrees with respect to the horizontal direction, for example, as illustrated in FIG. 10. The half mirror 424 has a rectangular shape.

The cylindrical lens 425 is disposed between the light scattering member 422 and the half mirror 424. The cylindrical lens 425 is a convex cylindrical lens protruding toward the half mirror 424. The axis of the cylindrical lens 425 extends in the direction along which the LED point light sources 421b are aligned. When the scattered light scattered from the light scattering member 422 is made incident on the cylindrical lens 425, the scattered light is enlarged along the circumferential direction of the cylindrical surface of the cylindrical lens 425.

The light diffusing member 426 is disposed between the cylindrical lens 425 and the half mirror 424. The light diffusing member 426 is a sheet member having a rectangular shape, for example, and diffuses the light having passed through the cylindrical lens 425. In this manner, diffused light is generated by the light diffusing member 426. For example, the light diffusing member 426 may have an isotropic diffusing function for diffusing the incident light in all directions of the surface of the light diffusing member 426, or have an anisotropic diffusing function for diffusing the incident light toward the axial direction of the cylindrical lens 425 (direction perpendicularly intersecting with circumferential direction of cylindrical surface of cylindrical lens 425).

The focusing lens 427 is disposed in the intersecting hole 423b. The focusing lens 427 has a function that changes the combined focal distance with respect to the lens 411.

As illustrated in FIGS. 10 to 13, the mirror member 430 is positioned below the illumination module 420, and reflects the light reflected from the end face Wc of the wafer W.

The mirror member 430 includes a main body 431 and a reflective surface 432. The main body 431 is made of as an aluminum block, for example.

The reflective surface 432 faces the end face Wc, and a peripheral section We around the lower surface Wb of the wafer W held by the holding table 201. The reflective surface 432 is inclined with respect to the rotational axis of the holding table 201.

The reflective surface 432 is a curved surface recessed in a direction moving away from the end face Wc of the wafer W held by the holding table 201. Therefore, when the end face Wc of the wafer W is reflected from the reflective surface 432, the mirror image is enlarged, compared with the actual image. The curvature radius of the reflective surface 432 is, for example, equal to or greater than 10 millimeters and equal to or less than 30 millimeters. Furthermore, the angular aperture (angle formed by two planes circumscribing reflective surface 432) of the reflective surface 432 is equal to or greater than 100 degrees and equal to or less than 150 degrees, for example.

In the illumination module 420, the light emitted from the light source 421 is scattered by the light scattering member 422, enlarged by the cylindrical lens 425, then diffused by the light diffusing member 426, passes through the half mirror 424 in the entirety, and is output downwardly. The diffused light having passed through the half mirror 424 is reflected from the reflective surface 432 of the mirror member 430 that is positioned below the half mirror 424. As illustrated in FIG. 12, the end face Wc and the peripheral section Wd around the upper surface Wa of the wafer W are mainly irradiated with the reflected light, which is a reflection of the diffused light on the reflective surface 432.

The reflected light reflected from the peripheral section Wd around the upper surface Wa of the wafer W is reflected again on the half mirror 424, without travelling to the reflective surface 432 of the mirror member 430, as illustrated in FIG. 13, passes through the lens 411 of the camera 410, without passing through the focusing lens 427, and becomes incident on the image sensor 412 of the camera 410.

By contrast, the reflected light reflected from the end face Wc of the wafer W is reflected again from the reflective surface 432 of the mirror member 430 and from the half mirror 424 one after another, passes through the focusing lens 427 and the lens 411 of the camera 410 one after another, and is made incident on the image sensor 412 of the camera 410.

In this manner, the light reflected from the peripheral section Wd around the upper surface Wa of the wafer W and the light reflected from the end face Wc of the wafer W and the mirror member 430 are both input to the image sensor 412 of the camera 410. Therefore, the first image capturing subunit 400 is able to capture an image of the peripheral section Wd around the upper surface Wa (section including peripheral portion around upper surface) of the wafer W and an image of the end face Wc of the wafer W, simultaneously.

Figure 14:
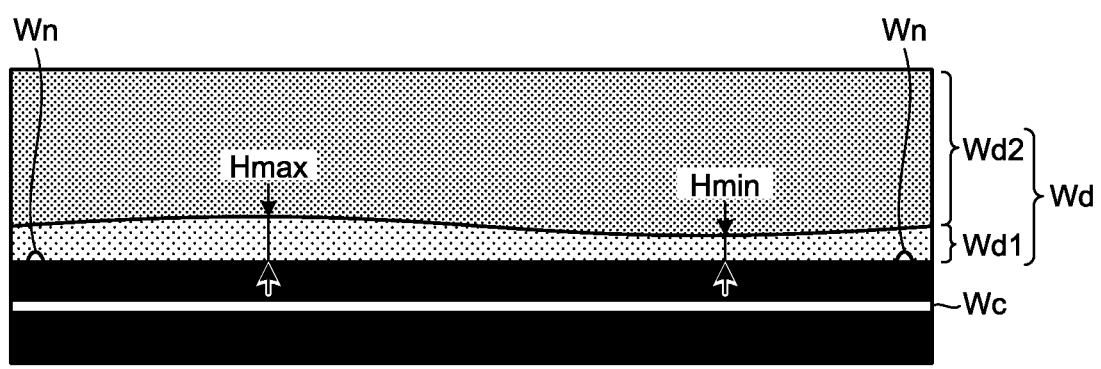
FIG. 14 is a schematic view illustrating one example of a captured image captured by the first image capturing subunit.

FIG. 14 is a schematic view illustrating one example of the images captured by the first image capturing subunit 400. As illustrated in FIG. 14, the image captured by the first image capturing subunit 400 includes an image of the peripheral section Wd around the upper surface Wa of the wafer W seen from above, and the end face Wc of the wafer W seen from a side.

The first image capturing subunit 400 captures the image of the peripheral section Wd around the upper surface Wa and the end face Wc of the wafer W within a range of 360 degrees or more with respect to the position of the notch Wn on the wafer W. Therefore, as illustrated in FIG. 14, the image includes the same notch Wn at the two positions (both ends of captured image).

As mentioned above, the focusing lens 427 is provided along the path of the light reflected from the reflective surface 432 of the mirror member 430 and reaching the lens 411. Therefore, although the length of the light path from the end face Wc of the wafer W to the image sensor 412 of the camera 410 is different from that of the light path from the peripheral section Wd around the upper surface Wa of the wafer W to the image sensor 412 of the camera 410, the position where the peripheral section Wd around the upper surface Wa of the wafer W is imaged and the position where the end face Wc of the wafer W is imaged can be adjusted onto the image sensor 412. Therefore, the image of the peripheral section Wd around the upper surface Wa of the wafer W and the image of the end face Wc of the wafer W are both able to be captured clearly. The focusing lens 427 is not disposed along the light path from the peripheral section Wd around the upper surface Wa of the wafer W to the image sensor 412 of the camera 410.

Figure 15:
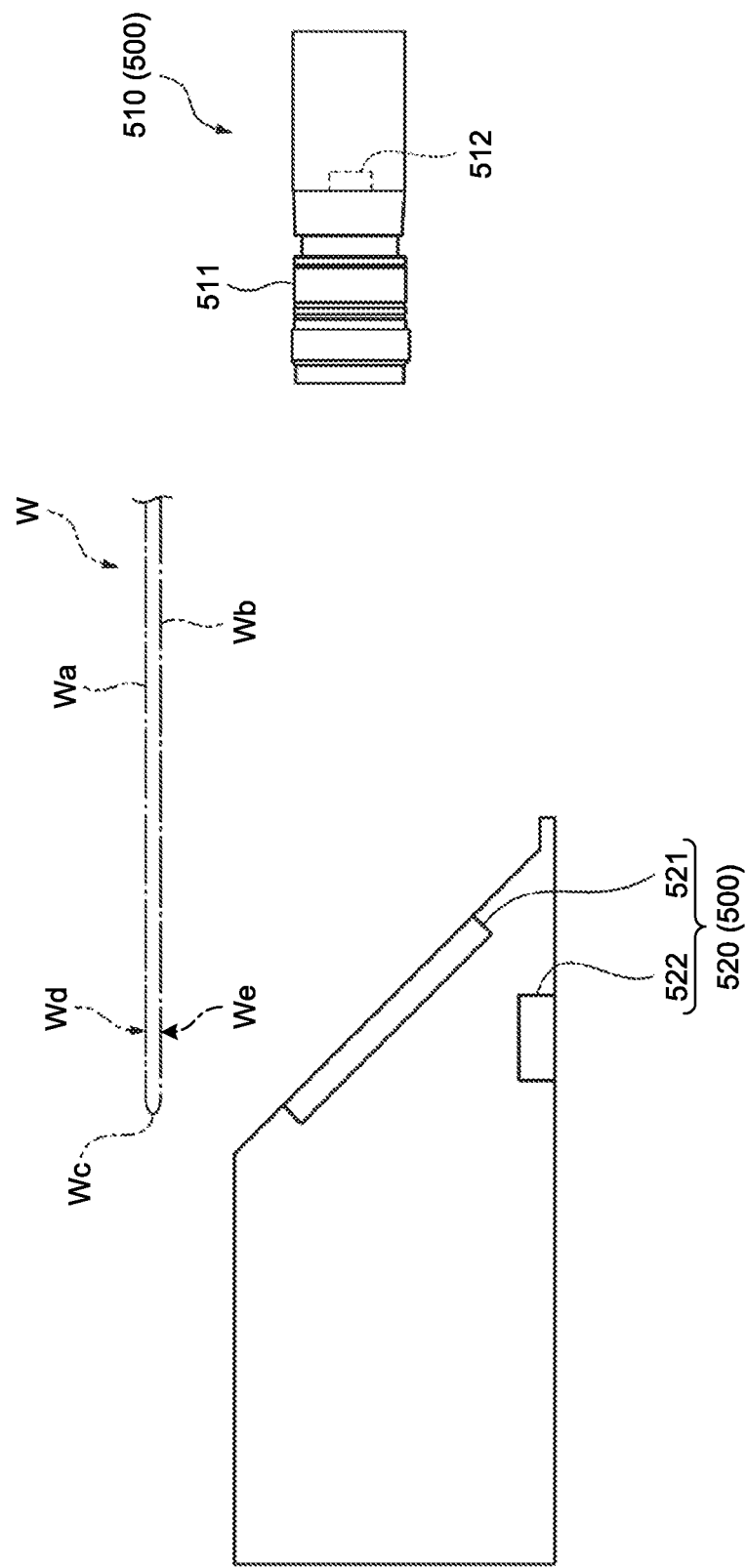
FIG. 15 is a schematic view illustrating the second image capturing subunit seen from a side.

A configuration of the second image capturing subunit 500 will now be explained, additionally referring to FIG. 15. FIG. 15 is a schematic view illustrating the second image capturing subunit 500 seen from a side. As illustrated in FIG. 15, the second image capturing subunit 500 includes the camera 510 (one example of image capturing unit on side of other surface) and the illumination module 520.

The camera 510 includes a lens 511 and an image sensor 512. The optical axis of the camera 510 extends horizontally toward the illumination module 520.

The illumination module 520 is positioned below the illumination module 420, and below the wafer W held by the holding table 201. The illumination module 520 includes a half mirror 521 and a light source 522. The half mirror 521 is disposed, for example, in a manner inclined by an angle of 45 degrees with respect to the horizontal direction. The half mirror 521 has a rectangular shape, for example.

The light emitted from the light source 522 that is positioned below the half mirror 521 passes through the half mirror 521 in the entirety, and is output upwardly. The light passed through the half mirror 521 passes through the lens 511 of the camera 510 and becomes incident on the image sensor 512 of the camera 510. In other words, the camera 510 can capture an image of the lower surface Wb of the wafer W within the area irradiated with the light from the light source 522 via the half mirror 521.

While the camera 410 in the first image capturing subunit 400 captures an image at a width within a range of 12 millimeters from the outer edge of the wafer W in the radial direction of the wafer W, for example, the camera 510 in the second image capturing subunit 500 captures an image at a width of 50 millimeters from the outer edge of the wafer W in the radial direction of the wafer W. In this manner, not only the condition of the area to be processed by the peripheral portion processing unit 18 but also the condition of the area to be processed by the lower surface processing unit 19 can be checked by using the captured image captured by the camera 510.

Configuration of Control Device

Figure 16:
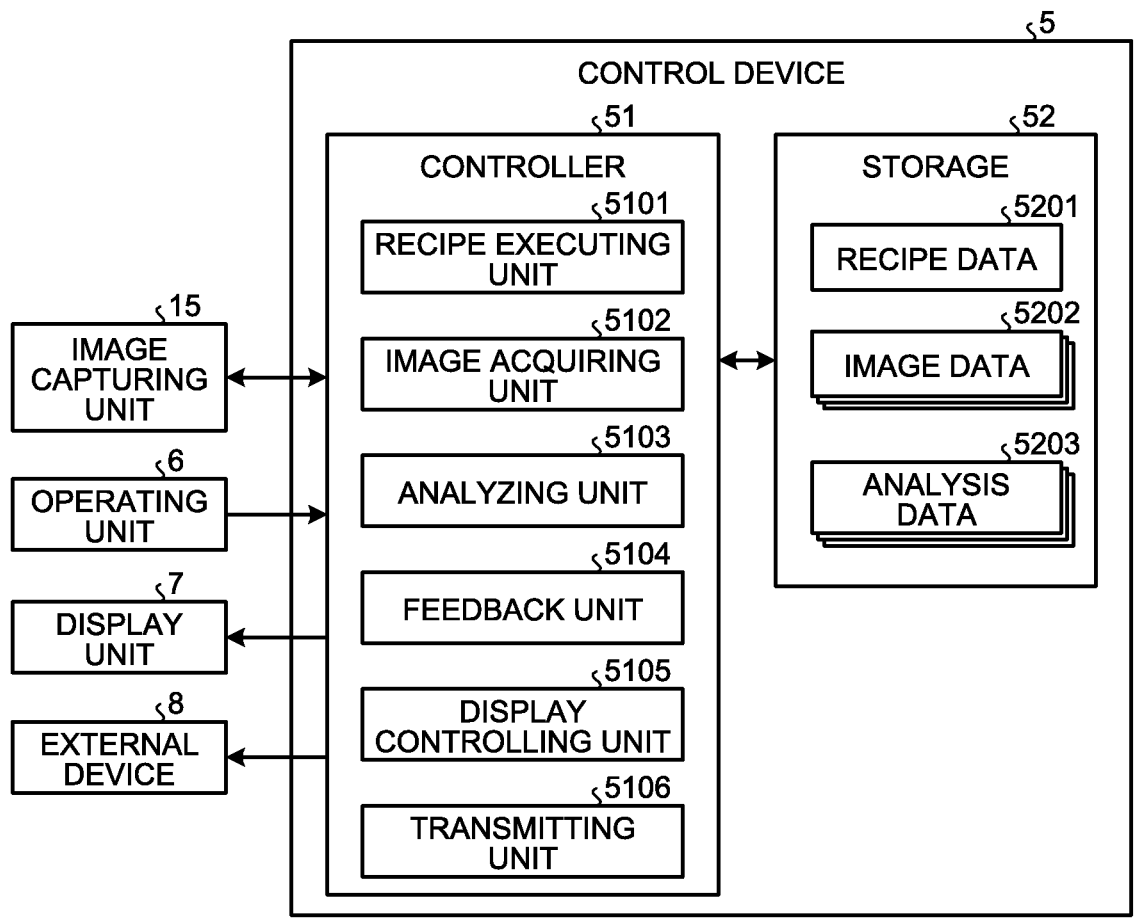
FIG. 16 is a block diagram illustrating one example of a configuration of a control device.

A configuration of the control device 5 will now be explained with reference to FIG. 16. FIG. 16 is a block diagram illustrating one example of a configuration of the control device 5.

As illustrated in FIG. 16, the controller 51 provided to the control device 5 includes, for example, a microcomputer having a central processing unit (CPU), a read-only memory (ROM), a random access memory (RAM), an input-output port, and the like; and various circuits. The controller 51 has a plurality of processing units that function by causing the CPU to execute a computer program stored in the ROM, using the RAM as a working area. Specifically, the controller 51 includes a recipe executing unit 5101, an image acquiring unit 5102, an analyzing unit 5103, a feedback unit 5104, a display controlling unit 5105, and a transmitting unit 5106. Some or the all of the recipe executing unit 5101, the image acquiring unit 5102, the analyzing unit 5103, the feedback unit 5104, the display controlling unit 5105, and the transmitting unit 5106 may be implemented using hardware such as an application specific integrated circuit (ASIC) or a field programmable gate array (FPGA).

The storage 52 in the control device 5 is implemented as a RAM, a semiconductor memory device such as a flash memory, or a storage device such as a hard disk and an optical disc. The storage 52 stores therein recipe data 5201, image data 5202, and analysis data 5203.

Recipe Executing Unit

The recipe executing unit 5101 causes the first transfer device 13, the second transfer device 17, the peripheral portion processing unit 18, and the lower surface processing unit 19 to perform a series of substrate processes to the wafer W, by controlling these devices in accordance with the recipe data 5201.

Figure 17:
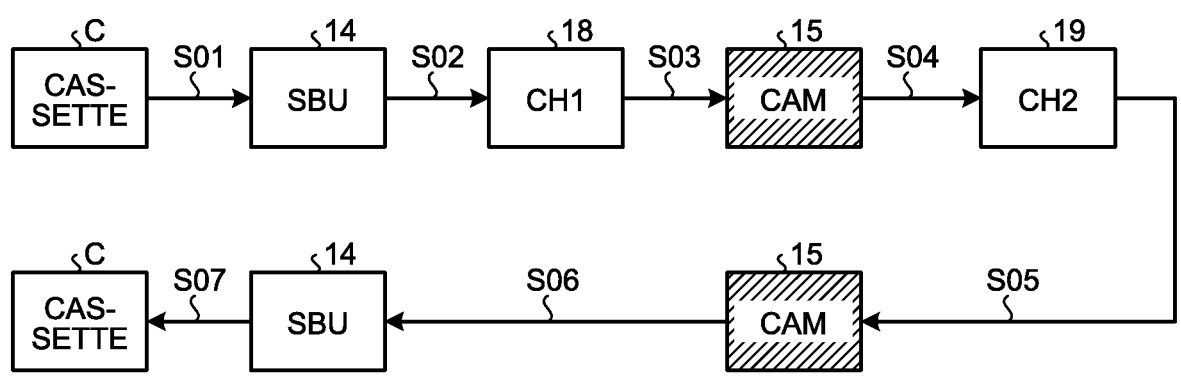
FIG. 17 is a diagram illustrating flow of the wafer that is transferred in the substrate processing system according to the embodiment.

The sequence of a series of substrate processes performed by the substrate processing system 1 according to the embodiment will now be explained with reference to FIG. 17. FIG. 17 is a diagram illustrating flow of the wafer W that is transferred in the substrate processing system 1 according to the embodiment.

As illustrated in FIG. 17, in the substrate processing system 1 according to the embodiment, to begin with, the first transfer device 13 takes out a plurality of wafers W from a cassette C and places the taken out wafers W on the substrate placing section 14 (Step S01). The second transfer device 17 then takes out one of the wafers W from the substrate placing section 14 and transfers the taken out wafer W to a peripheral portion processing unit 18 (Step S02).

The peripheral portion processing unit 18 then performs the peripheral portion removing process to the wafer W carried therein. Specifically, in the peripheral portion processing unit 18, to begin with, the holding section 821 of the substrate holding mechanism 82 holds the wafer W, and the driving section 823 is caused to rotate the holding section 821 so that the wafer W held by the holding section 821 is rotated thereby. The first moving mechanism 833 and the second moving mechanism 834 then place the upper nozzle 831 and the lower nozzle 832 to predetermined positions above and below the wafer W, respectively.

The chemical solution supplied from the chemical solution supply source 73 is then supplied to the peripheral portion around the upper surface and the peripheral portion of the lower surface of the rotating wafer W, via the upper nozzle 831 and the lower nozzle 832, respectively. In this manner, film is removed from the bevel portions of the wafer W. The peripheral portion processing unit 18 then performs the rinsing process and the drying process, and stops the rotation of the wafer W.

The second transfer device 17 then takes out the wafer W from the peripheral portion processing unit 18 and transfers the taken out wafer W to the image capturing unit 15 (Step S03).

The image capturing unit 15 then captures an image of the peripheral section Wd around the upper surface Wa, the end face Wc, and the peripheral section We around the lower surface Wb of the wafer W.

Figure 18:
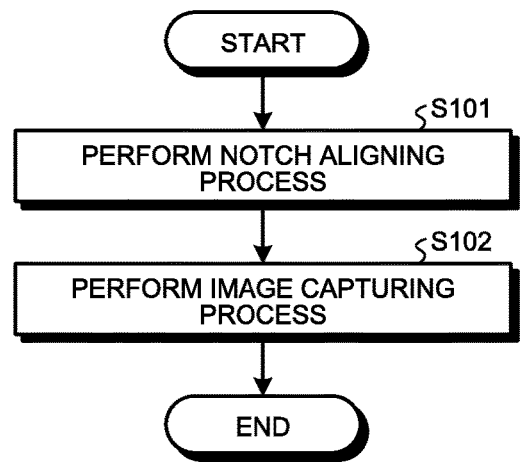
FIG. 18 is a flowchart illustrating sequence of a series of processes performed in the image capturing unit.

A series of processes performed by the image capturing unit 15 will now be explained with reference to FIG. 18. FIG. 18 is a flowchart illustrating sequence of a series of processes performed in the image capturing unit 15.

As illustrated in FIG. 18, to begin with, the image capturing unit 15 performs a notch aligning process (Step S101). The notch aligning process is a process for aligning the position of the notch Wn of the wafer W to a predetermined position.

Specifically, to begin with, the rotating holding subunit 200 suctions and holds the wafer W by using the holding table 201, and rotates the wafer W suctioned and held by the holding table 201 by rotating the holding table 201 using the actuator 202. The notch detecting subunit 300 then detects the notch Wn provided on the wafer W by detecting the light emitted from the light-emitting element 320 with the light-receiving element 330. The rotating holding subunit 200 then aligns the detected position of the notch Wn to the predetermined position by rotating the wafer W by a predetermined angle by using the actuator 202. In this manner, the rotated position of the wafer W is adjusted.

As described above, the rotating holding subunit 200, which suctions and holds the wafer W, and rotates the wafer W, and the notch detecting subunit 300, which detects the notch Wn provided on the wafer W, serve as one example of an adjusting mechanism for adjusting the rotated position of the wafer W with respect to an area to be captured by the image capturing unit 15. The image capturing unit 15 detects the notch Wn using the notch detecting subunit 300 while rotating the wafer W suctioned and held by the rotating holding subunit 200, and adjusts the rotated position of the wafer W based on the detection result of the notch Wn. The cutout portion provided on the wafer W may also be an orientation flat (what is called OF), for example, without limitation to the notch Wn.

Furthermore, explained herein is an example in which the image capturing unit 15 is provided with the rotating holding subunit 200 and the notch detecting subunit 300, as an example of the adjusting mechanism, but the configuration of the adjusting mechanism is not limited to the example described above. For example, when the rotated position of the wafer W is known, the image capturing unit 15 may include an encoder that detects the rotated position of the holding table 201, as well as the rotating holding subunit 200, as the adjusting mechanism. In such a case, after suctioning and holding the wafer W using the rotating holding subunit 200, the image capturing unit 15 is able to adjust the rotated position of the wafer W by rotating the holding table 201 by a predetermined angle, so that the image capturing process can be started from a specific position in the circumferential direction of the wafer W.

The image capturing unit 15 then performs the image capturing process (Step S102). The image capturing process is a process for capturing images of the peripheral section Wd around the upper surface Wa, the end face Wc, and the peripheral section We around the lower surface Wb of the wafer W.

Figure 19:
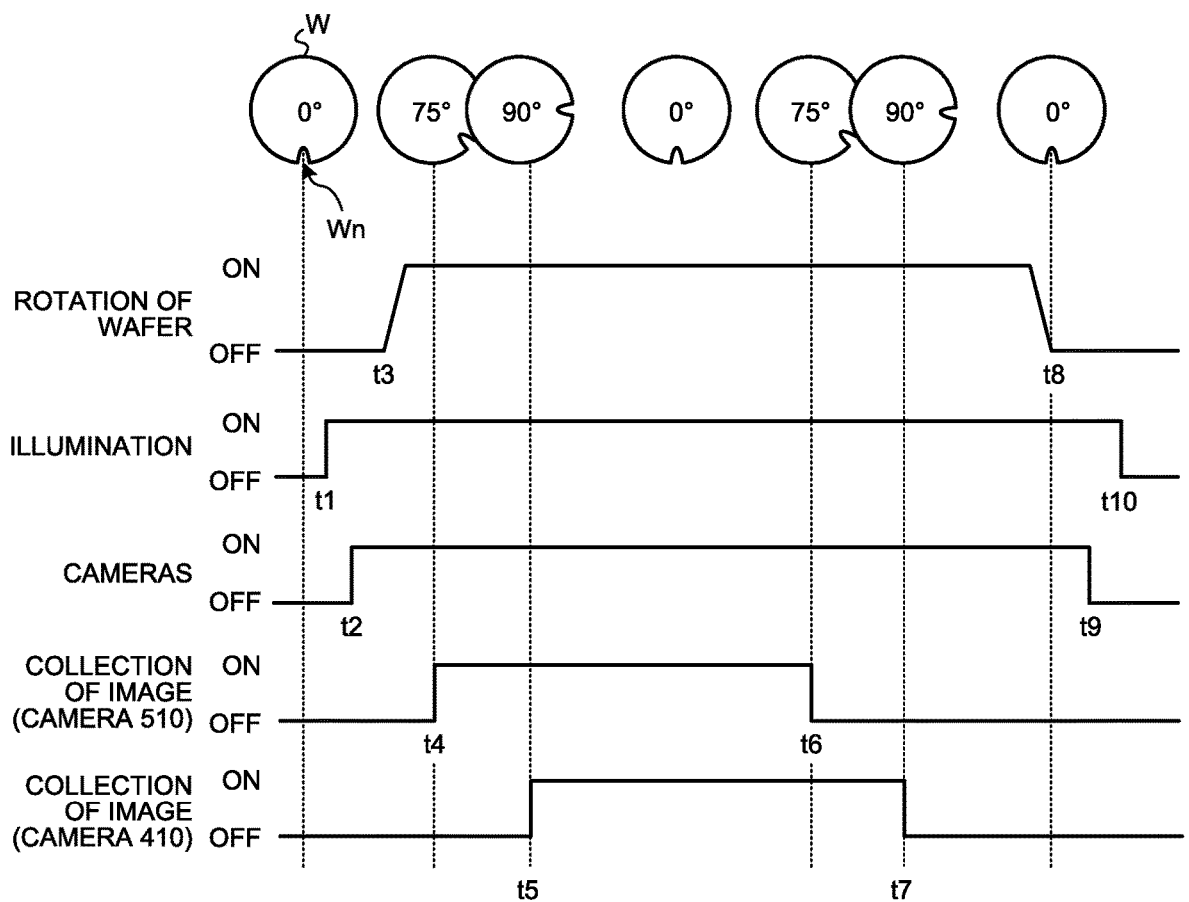
FIG. 19 is a timing chart illustrating sequence of an image capturing process.

The sequence of the image capturing process will now be explained with reference to FIG. 19. FIG. 19 is a timing chart illustrating sequence of the image capturing process. In the description below, the rotated position of the wafer W at the time at which the image capturing process is started is defined as 0 degrees.

As illustrated in FIG. 19, once the image capturing process is started, to begin with, the light source 421 of the illumination module 420 and the light sources 522 of the illumination module 520 are turned ON (see t1 in FIG. 19). The camera 410 and the camera 510 are then switched ON and start capturing images (see t2 in FIG. 19).

The wafer W held by the holding table 201 starts being rotated by causing the actuator 202 of the rotating holding subunit 200 to rotate the holding table 201 (see t3 in FIG. 19). At this time, the rotational speed of the wafer W is lower than that used in the notch aligning process.

The image data of the image captured by the camera 510 starts being collected at the timing at which an image of the notch Wn on the wafer W appears on the camera 510 (see t4 in FIG. 19). In this example, the collection of the image data is started at the timing at which the rotated position of the wafer W reaches 75 degrees. The collected image data is stored in the storage 52 in the control device 5.

The image data of the image captured by the camera 410 then starts being collected at the timing at which an image of the notch Wn on the wafer W appears on the camera 410, specifically, at the timing at which the rotated position of the wafer W reaches 90 degrees (see t5 in FIG. 19). The collected image data is stored in the storage 52 in the control device 5.

In the image capturing unit 15 according to the embodiment, because the location where the half mirror 521 is able to be installed is restricted by the presence of the mirror member 430, it is difficult to allow the camera 410 and the camera 510 to capture images of the peripheral sections Wd and We at the same rotated position of the wafer W. Therefore, in order to allow the camera 410 and the camera 510 to capture the same range, the timing for collecting the pieces of image data is shifted (see t4, t5 in FIG. 19). However, when the camera 410 and the camera 510 can capture images at the same rotated position, it is not necessary to shift the timing at which the pieces of image data are collected from the camera 410 and the camera 510.

At the timing at which the wafer W has rotated once and the rotated position of the wafer W reaches 75 degrees again, the collection of image data from the camera 510 is ended (see t6 in FIG. 19). In the same manner, at the timing at which the rotated position of the wafer W reaches 90 degrees again, the collection of the image data from the camera 410 is ended (see t7 in FIG. 19). In this manner, the image data of the peripheral sections Wd and We and the end face We across the entire circumference of the wafer W is acquired.

At the timing at which the rotated position of the wafer W reaches 0 degrees, the rotation of the wafer W is stopped (see t8 in FIG. 19). In this manner, the rotated position of the wafer W can be returned to the rotated position at the time at which the image capturing process is started, that is, the position to which the rotated position of the wafer W is adjusted by the notch aligning process. The cameras 410 and 510 are then switched OFF (see t9 in FIG. 19), the light source 421 of the illumination module 420 and the light source 522 of the illumination module 520 are turned OFF (see t10 in FIG. 19), and the image capturing process is ended.

In this manner, after the rotated position of the wafer W is adjusted by the notch aligning process, the image capturing unit 15 captures the images of the peripheral portion around the upper surface, the end face, and the peripheral portion around the lower surface of the wafer W across the entire circumference of the wafer W while rotating the wafer W with the rotating holding subunit 200. In this manner, image data of the peripheral portion around the upper surface, the end face, and the peripheral portion around the lower surface of the wafer W across the entire circumference of the wafer W can be acquired.

Once the image capturing unit 15 ends the image capturing process, the second transfer device 17 takes out the wafer W from the image capturing unit 15, and transfers the taken out wafer W to a lower surface processing unit 19 (Step S04), as illustrated in FIG. 17.

The lower surface processing unit 19 performs the lower surface removing process to the wafer W carried therein. Specifically, in the lower surface processing unit 19, to begin with, the holding section 921 of the substrate holding mechanism 92 holds the wafer W, and the driving section 923 is caused to rotate the holding section 921 so that the wafer W held by the holding section 921 is rotated thereby.

The chemical solution supplied from the chemical solution supply source 76 is then supplied via the supplying section 93 to the center of the lower surface Wb of the rotating wafer W. The chemical solution supplied to the center of the lower surface Wb of the wafer W spreads across the entire lower surface Wb as the wafer W is rotated. In this manner, film is removed from the entire lower surface Wb of the wafer W. The lower surface processing unit 19 then performs the rinsing process and the drying process, and stops the rotation of the wafer W.

Once the lower surface processing unit 19 ends the lower surface removing process, the second transfer device 17 takes out the wafer W from the lower surface processing unit 19, and transfers the taken out wafer W to the image capturing unit 15 (Step S05). In the image capturing unit 15, the aligning process and the image capturing process described above are performed once more. The image data acquired in the image capturing process is stored in the storage 52 in the control device 5.

The second transfer device 17 then takes out the wafer W from the image capturing unit 15 and places the taken out wafer W on the substrate placing section 14 (Step S06). The first transfer device 13 then takes out the wafer W from the substrate placing section 14 and accommodates the taken out wafer W in the cassette C (Step S07). In this manner, a series of substrate processes is ended.

Image Acquiring Unit

Referring back to FIG. 16, the explanation of the controller 51 will now be continued. The image acquiring unit 5102 acquires the image data from the image capturing unit 15, and stores the image data in the storage 52, in a manner associated with information such as the identification number of the wafer W and the date and time at which the images are captured, as the image data 5202.

Analyzing Unit

The analyzing unit 5103 performs an image analysis of the image data 5202 stored in the storage 52.

For example, the analyzing unit 5103 determines a removal degree of the film from the peripheral portion around the upper surface, and from the end face We of the wafer W, based on the data of the image captured by the camera 410, among the pieces of image data 5202. This determination is made based on the color difference (difference in pixel values) between an area Wd1 to which the chemical solution is supplied, and an area Wd2 to which no chemical solution is supplied (see FIG. 14), for example.

In the same manner, the analyzing unit 5103 determines a removal degree of the film from the peripheral section We around the lower surface Wb of the wafer W, based on the data of the image captured by the camera 510, among the pieces of image data 5202.

The analyzing unit 5103 also calculates a cut width, based on the data of the image captured by the camera 410, among the pieces of image data 5202.

Specifically, the analyzing unit 5103 calculates the cut width at each position across the entire circumference of the wafer W. The analyzing unit 5103 then calculates the average between the maximum cut width Hmax and the minimum cut width Hmin, among a plurality of calculated cut widths (see FIG. 14), as the cut width.

The way in which the cut width is calculated is not limited to the example described above. For example, the analyzing unit 5103 may calculate a cut width at each position across the entire circumference of the wafer W and calculate the average of a plurality of calculated cut widths as the cut width.

The analyzing unit 5103 also calculates the amount of eccentricity of the wafer W, based on the data of the image captured by the camera 410, among the pieces of image data 5202. The amount of eccentricity of the wafer W is an amount by which the center of the wafer W is offset from the rotational center of the substrate holding mechanism 82. For example, when the position of the center of the wafer W is offset from rotational center of the substrate holding mechanism 82, the cut width may become uneven along the peripheral section Wd around the upper surface Wa of the wafer W. This uneven cut width appears in the shape of a sine wave on the circumferential direction of the wafer W, as illustrated in FIG. 14. Therefore, the analyzing unit 5103 is able to calculate the amount of eccentricity of the wafer W based on the amplitude of the sine wave.

The analyzing unit 5103 also detects a defect in the peripheral section Wd around the upper surface Wa and the end face Wc of the wafer W, based on the data of the image captured by the camera 410, among the pieces of image data 5202. When there is a defect in the wafer W, the defect portion has a color that is different from that of the surroundings. Therefore, the analyzing unit 5103 is able to detect, for example, a pixel area having a pixel value that is different from those of the pixels adjacent thereto by a degree equal to or more than a threshold.

In the same manner, the analyzing unit 5103 detects a defect in the peripheral section We around the lower surface Wb of the wafer W based on the data of the image captured by the camera 510, among the pieces of image data 5202.

The analyzing unit 5103 can also identify the type of the defect based on the shape of the detected defect portion. Types of defects include a scratch or a chip-off.

The analyzing unit 5103 also calculates the amount of warpage in the wafer W, based on the data of the image captured by the camera 410, among the pieces of image data 5202. For example, the analyzing unit 5103 can calculate the amount of warpage in the wafer W, based on the shape of the end face Wc of the wafer W.

The analyzing unit 5103 then stores these analysis results in the storage 52 as the analysis data 5203.

Feedback Unit

The feedback unit 5104 corrects the time for which the chemical solution is discharged to the peripheral portion around the upper surface and the peripheral portion of the lower surface of the wafer W, via the upper nozzle 831 and the lower nozzle 832, respectively, in the peripheral portion process, by changing the recipe data 5201 based on the analysis data 5203 stored in the storage 52.

For example, the feedback unit 5104 extends the time for which the chemical solution is discharged from the upper nozzle 831 and the lower nozzle 832 in the peripheral portion removing process, by changing the recipe data 5201 based on the degree by which the film is removed from the peripheral portion around the upper surface and the end face We of the wafer W. In this manner, the time for which the chemical solution is discharged to a wafer W to be processed afterwards can be optimized.

The feedback unit 5104 also extends the time for which the chemical solution is discharged from the supplying section 93 in the lower surface removing process, by changing the recipe data 5201 based on the degree by which the film is removed from the lower surface Wb of the wafer W. In this manner, the time for which the chemical solution is discharged to the wafer W to be processed afterwards can be optimized.

The feedback unit 5104 also adjusts the positions of the upper nozzle 831 and the lower nozzle 832 that are used in the peripheral portion removing process by changing the recipe data 5201 based on the information of the cut width, among the pieces of analysis data 5203. For example, when the cut width included in the analysis data 5203 (average between maximum cut width Hmax and minimum Hmin) is greater than a default cut width, the feedback unit 5104 corrects the positions of the upper nozzle 831 and the lower nozzle 832 in such a manner that the chemical solution discharged from the upper nozzle 831 and the lower nozzle 832 is supplied on a more circumferentially outer side of the wafer W. In other words, the feedback unit 5104 corrects the positions processed by the upper nozzle 831 and the lower nozzle 832 in the peripheral portion process by changing the amount by which the upper nozzle 831 and the lower nozzle 832 are moved by the first moving mechanism 833 and the second moving mechanism 834, respectively. In this manner, the positions at which the chemical solution is discharged to the wafer W to be processed afterwards is able to be optimized.

The feedback unit 5104 also corrects the horizontal position of the wafer W with respect to the substrate holding mechanism 82 included in the peripheral portion processing unit 18 by changing the recipe data 5201 based on the information of the cut width, among the pieces of analysis data 5203.

For example, the feedback unit 5104 corrects the position at which the wafer W is suctioned to and held by the substrate holding mechanism 82 in such a manner that the difference between the cut width at the rotated position of 0 degrees and that at the rotated position of 180 degrees is reduced, and in such a manner that the difference between the cut width at the rotated position of 90 degrees and that at the rotated position of 270 degrees is reduced. In this manner, the operation of the second transfer device 17 placing the wafer W on the substrate holding mechanism 82 is corrected, and the eccentricity of the wafer W to be processed afterwards is suppressed.

In this example, the eccentricity of the wafer W is suppressed by correcting the operation of the second transfer device 17, but the target of the correction is not limited to the operation of the second transfer device 17. For example, when the peripheral portion processing unit 18 is provided with an adjusting mechanism for adjusting the horizontal position of the wafer W, it is possible to correct the position at which the wafer W is suctioned to and held by the substrate holding mechanism 82 by correcting the operation of the adjusting mechanism.

Display Controlling Unit

The display controlling unit 5105 takes out the image data 5202 from the storage 52 and displays the image data 5202 on a display unit 7, in response to a user operation performed on an operating unit 6, for example. In this manner, the user can check the conditions of the peripheral section Wd around the upper surface Wa, the peripheral section We around the lower surface Wb, and the end face We of the wafer W. The display controlling unit 5105 also takes out the analysis data 5203 from the storage 52 and displays the analysis data 5203 on the display unit 7, in response to a user operation made on the operating unit 6, for example. In this manner, the user can check the analysis results of the analyzing unit 5103.

The operating unit 6 is a keyboard or a touch panel, for example, and the display unit 7 is a liquid crystal display, for example. The operating unit 6 and the display unit 7 may be attached to the substrate processing system 1 or installed at a location away from the substrate processing system 1.

Transmitting Unit

The transmitting unit 5106 transmits the image data 5202 and the analysis data 5203 stored in the storage 52 to an external device 8 over a network such as a local area network (LAN). The transmitting unit 5106 may transmit newly stored image data 5202 or analysis data 5203 to the external device 8 every time the image data 5202 or the analysis data 5203 is stored in the storage 52.

Furthermore, the transmitting unit 5106 may also transmit image data 5202 or analysis data 5203 selected by a user via an operation of the operating unit 6, for example, to the external device 8.

As described above, the substrate processing system 1 according to the embodiment (one example of substrate processing apparatus) includes the carry-in/out station 2, the delivery station 3, the processing station 4, and the image capturing unit 15. The carry-in/out station 2 includes the first transfer device 13 that takes out and transfers a wafer W (one example of substrate) from the cassette C. The delivery station 3 includes the substrate placing section 14 that is disposed adjacently to the carry-in/out station 2, and on which the wafer W transferred by the first transfer device 13 is placed. The processing station 4 includes the second transfer device 17 that is disposed adjacently to the delivery station 3 and takes out and transfers the wafer W from the substrate placing section 14, and the peripheral portion processing units 18 and the lower surface processing units 19 (one example of processing unit) that process the wafer W transferred by the second transfer device 17. The image capturing unit 15 is provided in the delivery station 3 to capture an image of the wafer W. The image includes both of (i) the peripheral portion of the upper surface Wa or the lower surface Wb of the wafer W and (ii) the end face We of the wafer W.

The substrate processing system 1 according to the embodiment (one example of substrate processing apparatus) also includes the cassette placing section 11, the peripheral portion processing units 18 (one example of processing unit), the transfer section 12, the delivery station 3, the transfer section 16 (one example of transfer area), and the image capturing unit. On the cassette placing section 11, a cassette C accommodating a plurality of wafers W (one example of substrates) is placed. The peripheral portion processing unit 18 washes or etches the peripheral portion of a wafer W taken out from the cassette C. The transfer section 12, the delivery station 3, and the transfer section 16 are interposed between the cassette placing section 11 and the peripheral portion processing units 18, and transfer a wafer W. The image capturing unit 15 is provided in the delivery station 3 to capture an image of the wafer W processed by the peripheral portion processing unit 18. The image includes both of (i) the peripheral portion of the upper surface Wa or the lower surface Wb of the wafer W and (ii) the end face We of the wafer W.

Therefore, the substrate processing system 1 according to the embodiment is capable of checking the condition of the peripheral portion of the wafer W, while suppressing a size increase of the apparatus.

Modifications

In the embodiment described above, the image capturing unit 15 performs the image capturing process after the peripheral portion processing unit 18 has performed the peripheral portion removing process, and after the lower surface processing unit 19 has performed the lower surface removing process. However, the timing at which the image capturing process is performed is not limited to the example described above.

Figure 20:
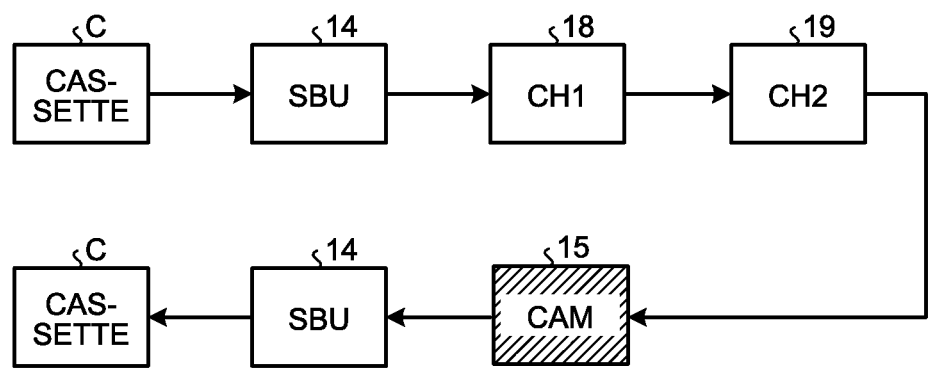
FIG. 20 is a diagram illustrating flow of the wafer that is transferred in a substrate processing system according to a first modification.
Figure 21:
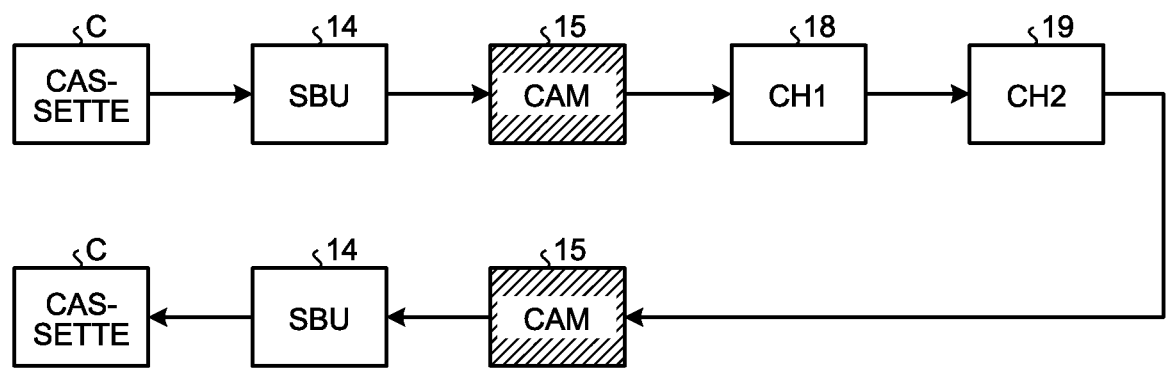
FIG. 21 is a diagram illustrating flow of the wafer that is transferred in a substrate processing system according to a second modification.
Figure 22:
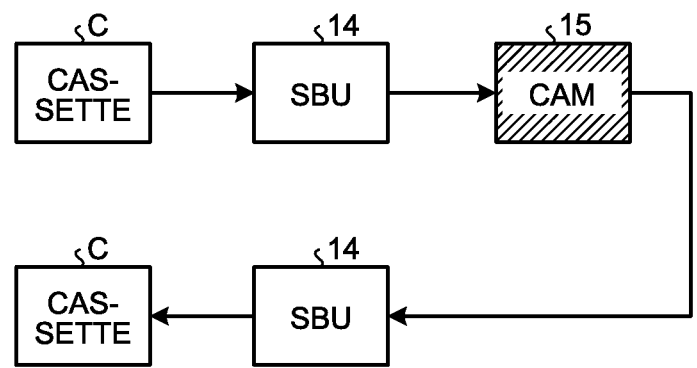
FIG. 22 is a diagram illustrating flow of the wafer that is transferred in a substrate processing system according to a third modification.

An modification of the timing at which the image capturing process is performed will now be explained with reference to FIGS. 20 to 22. FIG. 20 is a diagram illustrating the flow of the wafer W that is transferred in the substrate processing system 1 according to a first modification. FIG. 21 is a diagram illustrating flow of the wafer W that is transferred in the substrate processing system 1 according to a second modification. FIG. 22 is a diagram illustrating flow of the wafer W that is transferred in the substrate processing system 1 according to a third modification.

In the explanation below, the parts that are the same as those having already been explained will be represented with the same reference symbols as those having already been explained, and redundant explanations thereof will be omitted.

For example, as illustrated in FIG. 20, the substrate processing system 1 may perform the image capturing process after the lower surface processing unit 19 ends the lower surface removing process, without performing the image capturing process after the peripheral portion removing process. In this manner, the condition of the wafer W after the peripheral portion removing process and the lower surface removing process can be checked using only one image capturing process.

Furthermore, as illustrated in FIG. 21, the substrate processing system 1 may cause the image capturing unit 15 to perform the image capturing process not only after the lower surface removing process performed by the lower surface processing unit 19, but also before the peripheral portion removing process performed by the peripheral portion processing unit 18.

In such a case, the analyzing unit 5103 can detect a defect in the wafer W more accurately, based on the difference between the pieces of image data 5202 before and after the peripheral portion removing process. For example, if a defect is detected based on the image data 5202 after the lower surface removing process, the analyzing unit 5103 compares the detected defect portion with a portion corresponding to the portion where the defect is detected in the image data 5202 before the peripheral portion removing process. If there is no change between these portions, the analyzing unit 5103 detects the portion as a defect portion.

Furthermore, as illustrated in FIG. 22, the substrate processing system 1 may only perform the image capturing process, without performing the peripheral portion removing process and the lower surface removing process, which are performed by the peripheral portion processing unit 18 and the lower surface processing unit 19, respectively. In other words, in the substrate processing system 1, it is possible to carry a wafer W having its peripheral portion and lower surface processed by another apparatus into the image capturing unit 15, to perform the image capturing process to the wafer W, and to return the wafer W into the cassette C.

In the embodiment described above, an image of the peripheral section Wd around the upper surface Wa and the end face We of the wafer W are captured using the first image capturing subunit 400, and an image of the peripheral section We around the lower surface Wb of the wafer W is captured using the second image capturing subunit 500. However, the embodiment is not limited thereto, and an image of the peripheral section We around the lower surface Wb and the end face We of the wafer W may be captured with the first image capturing subunit 400, and the peripheral section Wd around the upper surface Wa of the wafer W may be captured with the second image capturing subunit 500, by reversing the positions of the first image capturing subunit 400 and the second image capturing subunit 500 in the vertical directions.

Furthermore, in the embodiment described above, the image capturing unit 15 is disposed in the delivery station 3, but the image capturing unit 15 may be disposed in the transfer area other than the delivery station 3, e.g., in the transfer section 12 or the transfer section 16.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate processing apparatus comprising:
    a cassette placing space on which a cassette accommodating a plurality of substrates is placed;
    a processing station that washes or etches a peripheral portion of each substrate taken out from the cassette, wherein the processing station includes at least one holding chuck (i) on which a substrate is suctioned such that the substrate is held horizontally or (ii) that grips a peripheral portion of a substrate such that the substrate is held horizontally, wherein the at least one holding chuck rotates about a vertical axis, and wherein the processing station discharges liquid to the substrate rotating along with the at least one holding chuck;
    a transfer area that is interposed between the cassette placing space and the processing station, and in which the substrate is transferred;
    a light source that emits light toward the substrate and along a direction perpendicular to the principal surface of the substrate;
    an angled half mirror disposed between the light source and the substrate;
    a mirror member having a curved reflective surface disposed below the light source and in proximity to the substrate; and
    a camera that is disposed in the transfer area to capture an image of the substrate processed by the processing station, the image including both of (i) a peripheral portion of an upper surface or a lower surface of the substrate and (ii) an end face of the substrate, wherein an optical axis of the camera extends horizontally, wherein the curved reflective surface of the mirror member reflects light emitted from the light source toward the end face of the substrate, wherein the principal surface of the substrate reflects light emitted from the light source upward toward the angled half-mirror, wherein the curved reflective surface of the mirror member reflects light reflected by the end face of the substrate upward toward the angled half mirror, and wherein the angled half mirror directs the light reflected upward by the principal surface of the substrate and the light reflected upward by the curved reflective surface of the mirror member horizontally toward the camera.

2. The substrate processing apparatus according to claim 1, wherein
the processing station includes a first chamber that washes or etches the peripheral portion of the upper surface of the substrate, wherein the first chamber of the processing station includes a first holding chuck of the at least one holding chuck on which the substrate is suctioned to hold the substrate horizontally and which rotates around the vertical axis, and at least one nozzle that discharges liquid to the peripheral portion of the substrate rotating along with the first holding chuck, and
the camera captures an image including both of (i) the peripheral portion of the upper surface and (ii) the end face of the substrate washed or etched by the first chamber of the processing station.

3. The substrate processing apparatus according to claim 2, wherein
the first chamber of the processing station washes or etches the peripheral portion of the upper surface and the peripheral portion of the lower surface of the substrate.

4. The substrate processing apparatus according to claim 3, wherein
the processing station includes a second chamber that washes or etches an entire lower surface of the substrate, wherein the second chamber of the processing station includes a second holding chuck of the at least one holding chuck that grips a peripheral portion of the substrate to hold the substrate horizontally and that rotates around the vertical axis, and a channel arranged in the second holding chuck that discharges liquid to the lower surface of the substrate, and
the camera captures an image of the peripheral portion of the lower surface of the substrate washed or etched by the second chamber of the processing station.

5. The substrate processing apparatus according to claim 4, further comprising:
a controller that controls the first chamber of the processing station, the second chamber of the processing station, and the camera, wherein
the controller causes the first chamber of the processing station to perform a peripheral portion process for washing or etching the peripheral portion of the upper surface and the peripheral portion of the lower surface of the substrate, causes the second chamber of the processing station to perform a lower surface process for washing or etching the entire lower surface of the substrate after the peripheral portion process, and causes the camera to perform an image capturing process for capturing an image including the peripheral portion of the upper surface, the end face, and the peripheral portion of the lower surface of the substrate after the lower surface process.

6. The substrate processing apparatus according to claim 5, wherein
the first chamber of the processing station etches the peripheral portion of the upper surface of the substrate in the peripheral portion process, and
the controller calculates, based on the image captured in the image capturing process, a removal width of film in the peripheral portion of the upper surface of the substrate.

7. The substrate processing apparatus according to claim 6, wherein
the first chamber of the processing station includes:
a movably provided nozzle of the at least one nozzle that supplies a chemical solution to the peripheral portion of the upper surface of the substrate;
the first chamber of the processing station moves, in the peripheral portion process, the movably provided nozzle to a processing position, and then supplies the chemical solution to the peripheral portion of the upper surface of the substrate via the movably provided nozzle so as to remove film from the peripheral portion of the upper surface of the substrate, and
the controller changes, based on the calculated removal width, an amount by which the movably provided nozzle is moved so as to correct the processing position in the peripheral portion process.

8. The substrate processing apparatus according to claim 5, wherein
the controller determines, based on the image captured in the image capturing process, a removal degree of the film from the peripheral portion of the upper surface of the substrate.

9. The substrate processing apparatus according to claim 8, wherein
the first chamber of the processing station includes:
a movably provided nozzle of the at least one nozzle that supplies a chemical solution to the peripheral portion of the upper surface of the substrate;
the first chamber of the processing station moves, in the peripheral portion process, the movably provided nozzle to a processing position, and then supplies the chemical solution to the peripheral portion of the upper surface of the substrate via the movably provided nozzle so as to remove film from the peripheral portion of the upper surface of the substrate, and
the controller corrects, based on the image captured by the image capturing process, a time period during which the chemical solution is discharged from the movably provided nozzle to the peripheral portion of the upper surface of the substrate in the peripheral portion process.

10. The substrate processing apparatus according to claim 5, wherein
the controller corrects, based on the image captured by the image capturing process, a horizontal position of the substrate in the peripheral portion process.

11. The substrate processing apparatus according to claim 5, wherein
the controller causes, before the peripheral portion process, the camera to perform the image capturing process, and detects a defect in the substrate based on a difference between the image captured in the image capturing process that is performed before the peripheral portion process, and an image captured in the image capturing process that is performed after the lower surface process.

12. The substrate processing apparatus according to claim 2, wherein
the processing station includes a second chamber that washes or etches an entire lower surface of the substrate, wherein the second chamber of the processing station includes a second holding chuck of the at least one holding chuck that grips a peripheral portion of the substrate to hold the substrate horizontally and that rotates around the vertical axis, and a channel arranged in the second holding chuck that discharges liquid to the lower surface of the substrate, and
the camera captures an image of the peripheral portion of the lower surface of the substrate washed or etched by the second chamber of the processing station.

13. The substrate processing apparatus according to claim 12, further comprising:
a controller that controls the first chamber of the processing station, the second chamber of the processing station, and the camera, wherein
the controller causes the first chamber of the processing station to perform a peripheral portion process for washing or etching the peripheral portion of the upper surface and the peripheral portion of the lower surface of the substrate, causes the second chamber of the processing station to perform a lower surface process for washing or etching an entire lower surface of the substrate after the peripheral portion process, and causes the camera to perform an image capturing process for capturing an image of the peripheral portion of the upper surface, the end face, and the peripheral portion of the lower surface of the substrate after the lower surface process.

14. The substrate processing apparatus according to claim 13, wherein
the first chamber of the processing station etches the peripheral portion of the upper surface of the substrate in the peripheral portion process, and
the controller calculates, based on the image captured in the image capturing process, a removal width of film in the peripheral portion of the upper surface of the substrate.

15. The substrate processing apparatus according to claim 14, wherein
the first chamber of the processing station includes:
a movably provided nozzle of the at least one nozzle that supplies a chemical solution to the peripheral portion of the upper surface of the substrate;
the first chamber of the processing station, in the peripheral portion process, film from the peripheral portion of the upper surface of the substrate by moving the movably provided nozzle to a processing position, and then supplying the chemical solution to the peripheral portion of the upper surface of the substrate via the movably provided nozzle, and
the controller corrects the processing position used in the peripheral portion process by changing an amount by which the movably provided nozzle is moved based on the calculated removal width.

16. The substrate processing apparatus according to claim 13, wherein
the controller determines a removal degree of the film from the peripheral portion of the upper surface of the substrate, based on the image captured by the image capturing process.

17. The substrate processing apparatus according to claim 16, wherein
the first chamber of the processing station includes:
a movably provided nozzle of the at least one nozzle that supplies a chemical solution to the peripheral portion of the upper surface of the substrate; and
the first chamber of the processing station moves, in the peripheral portion process, the movably provided nozzle to a processing position, and then supplies the chemical solution to the peripheral portion of the upper surface of the substrate via the movably provided nozzle so as to remove film from the peripheral portion of the upper surface of the substrate, and the controller corrects, based on the image captured in the image capturing process, a time period during which the chemical solution is discharged from the movably provided nozzle to the peripheral portion of the upper surface of the substrate in the peripheral portion process.

18. The substrate processing apparatus according to claim 13, wherein
the controller corrects a horizontal position of the substrate that is used in the peripheral portion process, based on the image captured by the image capturing process.

19. The substrate processing apparatus according to claim 13, wherein
the controller causes, before the peripheral portion process, the camera to perform the image capturing process, and detects a defect in the substrate based on a difference between the image captured in the image capturing process that is performed before the peripheral portion process, and the image captured in the image capturing process that is performed after the lower surface process.

* * * * *